United States Patent
Fukuda

(10) Patent No.: US 8,390,482 B2
(45) Date of Patent: Mar. 5, 2013

(54) ENCODING APPARATUS, INFORMATION PROCESSING APPARATUS, ENCODING METHOD, AND DATA TRANSMISSION METHOD

(75) Inventor: Kunio Fukuda, Tokyo (JP)

(73) Assignee: Sony Corporation, Tokyo (JP)

( * ) Notice: Subject to any disclaimer, the term of this patent is extended or adjusted under 35 U.S.C. 154(b) by 289 days.

(21) Appl. No.: 12/849,178

(22) Filed: Aug. 3, 2010

(65) Prior Publication Data

US 2011/0038428 A1    Feb. 17, 2011

(30) Foreign Application Priority Data

Aug. 12, 2009   (JP) .................................. 2009-187371

(51) Int. Cl.
*H03M 7/00* (2006.01)
(52) U.S. Cl. .......................................... 341/56; 341/58
(58) Field of Classification Search ................ 341/56, 341/57, 58, 59, 106; 375/292
See application file for complete search history.

(56) References Cited

U.S. PATENT DOCUMENTS

| | | | | |
|---|---|---|---|---|
| 5,525,983 A | * | 6/1996 | Patel et al. | 341/57 |
| 5,633,631 A | * | 5/1997 | Teckman | 341/58 |
| 5,818,362 A | * | 10/1998 | Walker | 341/57 |

FOREIGN PATENT DOCUMENTS

JP    03-109843    5/1991

* cited by examiner

*Primary Examiner* — Howard Williams
(74) *Attorney, Agent, or Firm* — Wolf, Greenfield & Sacks, P.C.

(57) ABSTRACT

Provided is an encoding apparatus including an encoding unit that generates encoded data formed from a sequence of base-k data in which m pieces (m<n) of base-k symbols are combined, by converting input binary data in units of n bits based on a specific conversion rule that associates n-bit binary data and the base-k data. In case a DC balance of the base-k data obtained after conversion has a polarity, the encoding unit controls a polarity of a symbol included in the base-k data obtained after conversion such that the polarity of the DC balance of the base-k data obtained after conversion is different from a polarity of a DC balance of a sequence of base-k data previous to the base-k data obtained after conversion.

7 Claims, 25 Drawing Sheets

FIG. 6
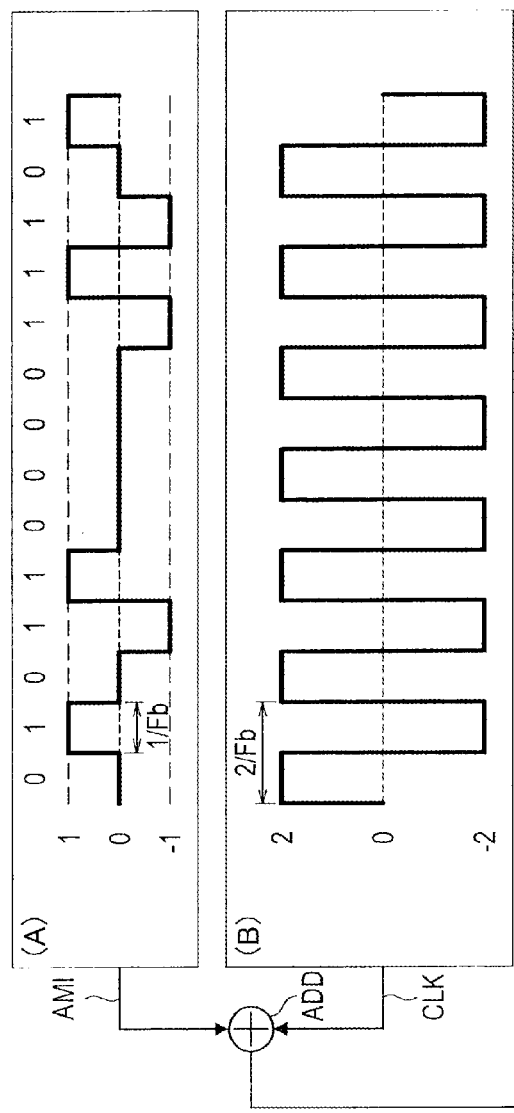
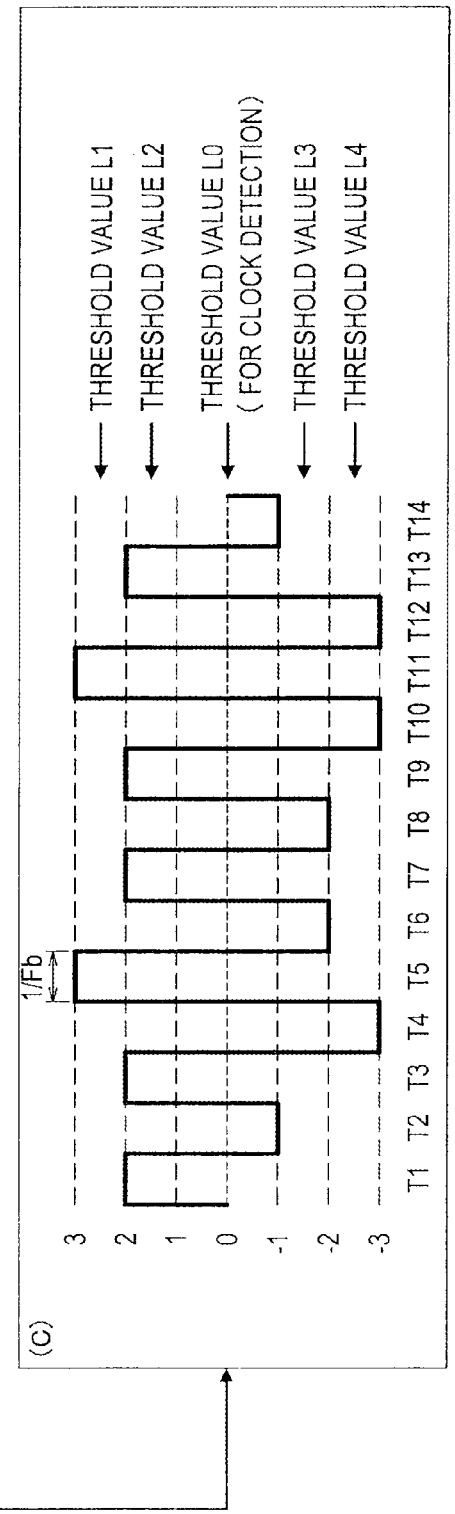

EYE PATTERN

FREQUENCY SPECTRUM

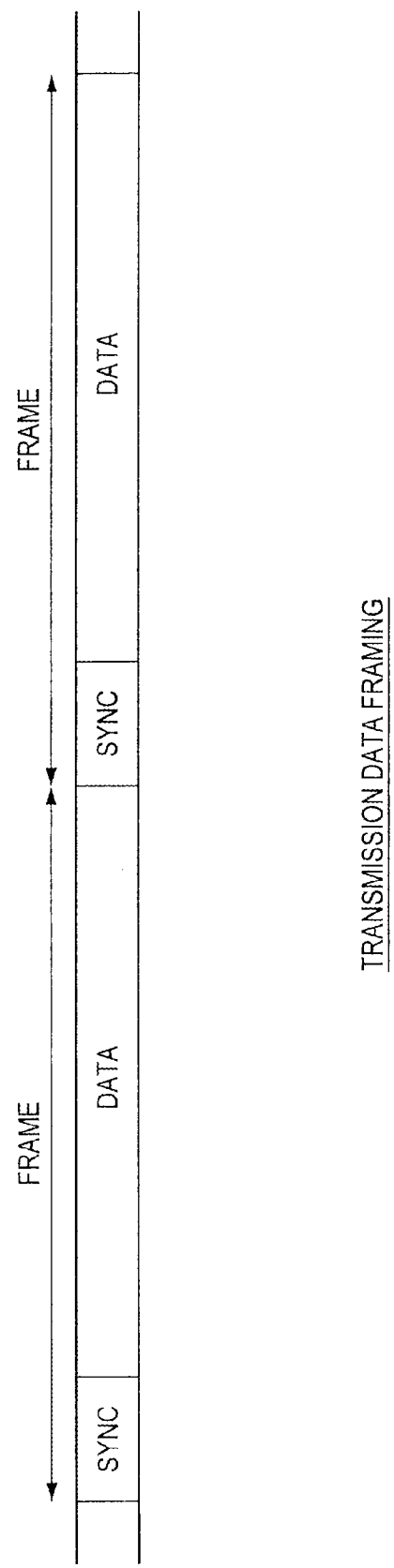

FIG. 13A

| 8bit Data | 6T Data | | | | | | Total |
|---|---|---|---|---|---|---|---|
| 00 | +1 | −1 | 0 | 0 | +1 | −1 | 0 |
| 01 | 0 | +1 | −1 | +1 | −1 | 0 | 0 |
| 02 | +1 | −1 | 0 | +1 | −1 | 0 | 0 |
| 03 | −1 | 0 | +1 | +1 | −1 | 0 | 0 |
| 04 | −1 | 0 | +1 | 0 | +1 | −1 | 0 |
| 05 | 0 | +1 | −1 | −1 | 0 | +1 | 0 |
| 06 | +1 | −1 | 0 | −1 | 0 | +1 | 0 |
| 07 | −1 | 0 | +1 | −1 | 0 | +1 | 0 |
| 08 | −1 | +1 | 0 | 0 | +1 | −1 | 0 |
| 09 | 0 | −1 | +1 | +1 | −1 | 0 | 0 |
| 0A | −1 | +1 | 0 | +1 | −1 | 0 | 0 |
| 0B | +1 | 0 | −1 | +1 | −1 | 0 | 0 |
| 0C | +1 | 0 | −1 | 0 | +1 | −1 | 0 |
| 0D | 0 | −1 | +1 | −1 | 0 | +1 | 0 |
| 0E | −1 | +1 | 0 | −1 | 0 | +1 | 0 |
| 0F | +1 | 0 | −1 | −1 | 0 | +1 | 0 |

| 8bit Data | 6T Data | | | | | | Total |
|---|---|---|---|---|---|---|---|
| 10 | +1 | 0 | +1 | −1 | −1 | 0 | 0 |
| 11 | +1 | +1 | 0 | −1 | 0 | −1 | 0 |
| 12 | +1 | 0 | +1 | −1 | 0 | −1 | 0 |
| 13 | 0 | +1 | +1 | −1 | 0 | −1 | 0 |
| 14 | 0 | +1 | +1 | −1 | −1 | 0 | 0 |
| 15 | +1 | +1 | 0 | 0 | −1 | −1 | 0 |
| 16 | +1 | 0 | +1 | 0 | −1 | −1 | 0 |
| 17 | 0 | +1 | +1 | 0 | −1 | −1 | 0 |
| 18 | 0 | +1 | −1 | 0 | +1 | −1 | 0 |
| 19 | 0 | +1 | −1 | 0 | −1 | +1 | 0 |
| 1A | 0 | +1 | −1 | +1 | +1 | −1 | +1 |
| 1B | 0 | +1 | −1 | 0 | 0 | +1 | +1 |
| 1C | 0 | −1 | +1 | 0 | 0 | +1 | +1 |
| 1D | 0 | −1 | +1 | +1 | +1 | −1 | +1 |
| 1E | 0 | −1 | +1 | 0 | −1 | +1 | 0 |
| 1F | 0 | −1 | +1 | 0 | +1 | −1 | 0 |

| 8bit Data | 6T Data | | | | | | Total |
|---|---|---|---|---|---|---|---|
| 20 | 0 | 0 | −1 | +1 | +1 | −1 | 0 |
| 21 | −1 | −1 | +1 | 0 | 0 | +1 | 0 |
| 22 | +1 | +1 | −1 | 0 | +1 | −1 | +1 |
| 23 | +1 | +1 | −1 | 0 | −1 | +1 | +1 |
| 24 | 0 | 0 | +1 | 0 | −1 | +1 | +1 |
| 25 | 0 | 0 | +1 | 0 | +1 | −1 | +1 |
| 26 | 0 | 0 | −1 | 0 | 0 | +1 | 0 |
| 27 | −1 | −1 | +1 | +1 | +1 | −1 | 0 |
| 28 | −1 | 0 | −1 | +1 | +1 | 0 | 0 |
| 29 | −1 | −1 | 0 | +1 | 0 | +1 | 0 |
| 2A | −1 | 0 | −1 | +1 | 0 | +1 | 0 |
| 2B | 0 | −1 | −1 | +1 | 0 | +1 | 0 |
| 2C | 0 | −1 | −1 | +1 | +1 | 0 | 0 |
| 2D | −1 | −1 | 0 | 0 | +1 | +1 | 0 |
| 2E | −1 | 0 | −1 | 0 | +1 | +1 | 0 |
| 2F | 0 | −1 | −1 | 0 | +1 | +1 | 0 |

| 8bit Data | 6T Data | | | | | | Total |
|---|---|---|---|---|---|---|---|
| 30 | +1 | −1 | 0 | 0 | −1 | +1 | 0 |
| 31 | 0 | +1 | −1 | −1 | +1 | 0 | 0 |
| 32 | +1 | −1 | 0 | −1 | +1 | 0 | 0 |
| 33 | −1 | 0 | +1 | −1 | +1 | 0 | 0 |
| 34 | −1 | 0 | +1 | 0 | −1 | +1 | 0 |
| 35 | 0 | +1 | −1 | +1 | 0 | −1 | 0 |
| 36 | +1 | −1 | 0 | +1 | 0 | −1 | 0 |
| 37 | −1 | 0 | +1 | +1 | 0 | −1 | 0 |
| 38 | −1 | +1 | 0 | 0 | −1 | +1 | 0 |
| 39 | 0 | −1 | +1 | −1 | +1 | 0 | 0 |
| 3A | −1 | +1 | 0 | −1 | +1 | 0 | 0 |
| 3B | +1 | 0 | −1 | −1 | +1 | 0 | 0 |
| 3C | +1 | 0 | −1 | 0 | −1 | +1 | 0 |
| 3D | 0 | −1 | +1 | +1 | 0 | −1 | 0 |
| 3E | −1 | +1 | 0 | +1 | 0 | −1 | 0 |
| 3F | +1 | 0 | −1 | +1 | 0 | −1 | 0 |

FIG. 13B

| 8bit Data | 6T Data | | | | | | Total |
|---|---|---|---|---|---|---|---|
| 40 | +1 | 0 | +1 | 0 | 0 | -1 | +1 |
| 41 | +1 | +1 | 0 | 0 | -1 | 0 | +1 |
| 42 | +1 | 0 | +1 | 0 | -1 | 0 | +1 |
| 43 | 0 | +1 | +1 | 0 | -1 | 0 | +1 |
| 44 | 0 | +1 | +1 | 0 | 0 | -1 | +1 |
| 45 | +1 | +1 | 0 | -1 | 0 | 0 | +1 |
| 46 | +1 | 0 | +1 | -1 | 0 | 0 | +1 |
| 47 | 0 | +1 | +1 | -1 | 0 | 0 | +1 |
| 48 | 0 | 0 | 0 | +1 | 0 | 0 | +1 |
| 49 | 0 | 0 | 0 | -1 | +1 | +1 | +1 |
| 4A | 0 | 0 | 0 | +1 | -1 | +1 | +1 |
| 4B | 0 | 0 | 0 | +1 | +1 | -1 | +1 |
| 4C | 0 | 0 | 0 | -1 | +1 | 0 | 0 |
| 4D | 0 | 0 | 0 | -1 | 0 | +1 | 0 |
| 4E | 0 | 0 | 0 | +1 | -1 | 0 | 0 |
| 4F | 0 | 0 | 0 | +1 | 0 | -1 | 0 |

| 8bit Data | 6T Data | | | | | | Total |
|---|---|---|---|---|---|---|---|
| 50 | +1 | 0 | +1 | -1 | -1 | +1 | +1 |
| 51 | +1 | +1 | 0 | -1 | +1 | -1 | +1 |
| 52 | +1 | 0 | +1 | -1 | +1 | -1 | +1 |
| 53 | 0 | +1 | +1 | -1 | +1 | -1 | +1 |
| 54 | 0 | +1 | +1 | -1 | -1 | +1 | +1 |
| 55 | +1 | +1 | 0 | +1 | -1 | -1 | +1 |
| 56 | +1 | 0 | +1 | +1 | -1 | -1 | +1 |
| 57 | 0 | +1 | +1 | +1 | -1 | -1 | +1 |
| 58 | +1 | +1 | +1 | 0 | -1 | -1 | +1 |
| 59 | +1 | +1 | +1 | -1 | 0 | -1 | +1 |
| 5A | +1 | +1 | +1 | -1 | -1 | 0 | +1 |
| 5B | +1 | +1 | 0 | -1 | -1 | 0 | 0 |
| 5C | +1 | +1 | 0 | -1 | -1 | +1 | +1 |
| 5D | +1 | +1 | 0 | 0 | 0 | -1 | +1 |
| 5E | -1 | -1 | +1 | +1 | +1 | 0 | +1 |
| 5F | 0 | 0 | -1 | +1 | +1 | 0 | +1 |

| 8bit Data | 6T Data | | | | | | Total |
|---|---|---|---|---|---|---|---|
| 60 | 0 | -1 | 0 | +1 | +1 | 0 | +1 |
| 61 | 0 | 0 | -1 | +1 | 0 | +1 | +1 |
| 62 | 0 | -1 | 0 | +1 | 0 | +1 | +1 |
| 63 | -1 | 0 | 0 | +1 | 0 | +1 | +1 |
| 64 | -1 | 0 | 0 | +1 | +1 | 0 | +1 |
| 65 | 0 | 0 | -1 | 0 | +1 | +1 | +1 |
| 66 | 0 | -1 | 0 | 0 | +1 | +1 | +1 |
| 67 | -1 | 0 | 0 | 0 | +1 | +1 | +1 |
| 68 | -1 | +1 | -1 | +1 | +1 | 0 | +1 |
| 69 | -1 | -1 | +1 | +1 | 0 | +1 | +1 |
| 6A | -1 | +1 | -1 | +1 | 0 | +1 | +1 |
| 6B | +1 | -1 | -1 | +1 | 0 | +1 | +1 |
| 6C | +1 | -1 | -1 | +1 | +1 | 0 | +1 |
| 6D | -1 | -1 | +1 | 0 | +1 | +1 | +1 |
| 6E | -1 | +1 | -1 | 0 | +1 | +1 | +1 |
| 6F | +1 | -1 | -1 | 0 | +1 | +1 | +1 |

| 8bit Data | 6T Data | | | | | | Total |
|---|---|---|---|---|---|---|---|
| 70 | -1 | +1 | +1 | 0 | 0 | 0 | +1 |
| 71 | +1 | -1 | +1 | 0 | 0 | 0 | +1 |
| 72 | +1 | +1 | -1 | 0 | 0 | 0 | +1 |
| 73 | 0 | 0 | +1 | 0 | 0 | 0 | +1 |
| 74 | -1 | 0 | +1 | 0 | 0 | 0 | 0 |
| 75 | 0 | -1 | +1 | 0 | 0 | 0 | 0 |
| 76 | +1 | 0 | -1 | 0 | 0 | 0 | 0 |
| 77 | 0 | +1 | -1 | 0 | 0 | 0 | 0 |
| 78 | 0 | -1 | -1 | +1 | +1 | +1 | +1 |
| 79 | -1 | 0 | -1 | +1 | +1 | +1 | +1 |
| 7A | -1 | -1 | 0 | +1 | +1 | +1 | +1 |
| 7B | -1 | -1 | 0 | +1 | +1 | 0 | 0 |
| 7C | +1 | +1 | -1 | 0 | 0 | -1 | 0 |
| 7D | 0 | 0 | +1 | 0 | 0 | -1 | 0 |
| 7E | +1 | +1 | -1 | -1 | -1 | 0 | 0 |
| 7F | 0 | 0 | +1 | -1 | -1 | +1 | 0 |

FIG. 13C

| 8bit Data | 6T Data | | | | | | Total |
|---|---|---|---|---|---|---|---|
| 80 | +1 | −1 | +1 | 0 | 0 | −1 | 0 |
| 81 | +1 | +1 | −1 | 0 | −1 | 0 | 0 |
| 82 | +1 | −1 | +1 | 0 | −1 | 0 | 0 |
| 83 | −1 | +1 | +1 | 0 | −1 | 0 | 0 |
| 84 | −1 | +1 | +1 | 0 | 0 | −1 | 0 |
| 85 | +1 | +1 | −1 | −1 | 0 | 0 | 0 |
| 86 | +1 | −1 | +1 | −1 | 0 | 0 | 0 |
| 87 | −1 | +1 | +1 | −1 | 0 | 0 | 0 |
| 88 | 0 | +1 | 0 | 0 | 0 | −1 | 0 |
| 89 | 0 | 0 | +1 | 0 | −1 | 0 | 0 |
| 8A | 0 | +1 | 0 | 0 | −1 | 0 | 0 |
| 8B | +1 | 0 | 0 | 0 | −1 | 0 | 0 |
| 8C | +1 | 0 | 0 | 0 | 0 | −1 | 0 |
| 8D | 0 | 0 | +1 | −1 | 0 | 0 | 0 |
| 8E | 0 | +1 | 0 | −1 | 0 | 0 | 0 |
| 8F | +1 | 0 | 0 | −1 | 0 | 0 | 0 |

| 8bit Data | 6T Data | | | | | | Total |
|---|---|---|---|---|---|---|---|
| 90 | +1 | −1 | +1 | −1 | −1 | +1 | 0 |
| 91 | +1 | +1 | −1 | −1 | +1 | −1 | 0 |
| 92 | +1 | −1 | +1 | −1 | +1 | −1 | 0 |
| 93 | −1 | +1 | +1 | −1 | +1 | −1 | 0 |
| 94 | −1 | +1 | +1 | −1 | −1 | +1 | 0 |
| 95 | +1 | +1 | −1 | +1 | −1 | −1 | 0 |
| 96 | +1 | −1 | +1 | +1 | −1 | −1 | 0 |
| 97 | −1 | +1 | +1 | +1 | −1 | −1 | 0 |
| 98 | 0 | +1 | 0 | −1 | −1 | +1 | 0 |
| 99 | 0 | 0 | +1 | −1 | +1 | −1 | 0 |
| 9A | 0 | +1 | 0 | −1 | +1 | −1 | 0 |
| 9B | +1 | 0 | 0 | −1 | +1 | −1 | 0 |
| 9C | +1 | 0 | 0 | −1 | −1 | +1 | 0 |
| 9D | 0 | 0 | +1 | +1 | −1 | −1 | 0 |
| 9E | 0 | +1 | 0 | +1 | −1 | −1 | 0 |
| 9F | +1 | 0 | 0 | +1 | −1 | −1 | 0 |

| 8bit Data | 6T Data | | | | | | Total |
|---|---|---|---|---|---|---|---|
| A0 | 0 | −1 | 0 | +1 | +1 | −1 | 0 |
| A1 | 0 | 0 | −1 | +1 | −1 | +1 | 0 |
| A2 | 0 | −1 | 0 | +1 | −1 | +1 | 0 |
| A3 | −1 | 0 | 0 | +1 | −1 | +1 | 0 |
| A4 | −1 | 0 | 0 | +1 | +1 | −1 | 0 |
| A5 | 0 | 0 | −1 | −1 | +1 | +1 | 0 |
| A6 | 0 | −1 | 0 | −1 | +1 | +1 | 0 |
| A7 | −1 | 0 | 0 | −1 | +1 | +1 | 0 |
| A8 | −1 | +1 | −1 | +1 | +1 | −1 | 0 |
| A9 | −1 | −1 | +1 | +1 | −1 | +1 | 0 |
| AA | −1 | +1 | −1 | +1 | −1 | +1 | 0 |
| AB | +1 | −1 | −1 | +1 | −1 | +1 | 0 |
| AC | +1 | −1 | −1 | +1 | +1 | −1 | 0 |
| AD | −1 | −1 | +1 | −1 | +1 | +1 | 0 |
| AE | −1 | +1 | −1 | −1 | +1 | +1 | 0 |
| AF | +1 | −1 | −1 | −1 | +1 | +1 | 0 |

| 8bit Data | 6T Data | | | | | | Total |
|---|---|---|---|---|---|---|---|
| B0 | 0 | −1 | 0 | 0 | 0 | +1 | 0 |
| B1 | 0 | 0 | −1 | 0 | +1 | 0 | 0 |
| B2 | 0 | −1 | 0 | 0 | +1 | 0 | 0 |
| B3 | −1 | 0 | 0 | 0 | +1 | 0 | 0 |
| B4 | −1 | 0 | 0 | 0 | 0 | +1 | 0 |
| B5 | 0 | 0 | −1 | +1 | 0 | 0 | 0 |
| B6 | 0 | −1 | 0 | +1 | 0 | 0 | 0 |
| B7 | −1 | 0 | 0 | +1 | 0 | 0 | 0 |
| B8 | −1 | +1 | −1 | 0 | 0 | +1 | 0 |
| B9 | −1 | −1 | +1 | 0 | +1 | 0 | 0 |
| BA | −1 | +1 | −1 | 0 | +1 | 0 | 0 |
| BB | +1 | −1 | −1 | 0 | +1 | 0 | 0 |
| BC | +1 | −1 | −1 | 0 | 0 | +1 | 0 |
| BD | −1 | −1 | +1 | +1 | 0 | 0 | 0 |
| BE | −1 | +1 | −1 | +1 | 0 | 0 | 0 |
| BF | +1 | −1 | −1 | +1 | 0 | 0 | 0 |

FIG. 13D

| 8bit Data | 6T Data | | | | | | Total |
|---|---|---|---|---|---|---|---|
| C0 | +1 | -1 | +1 | 0 | +1 | -1 | +1 |
| C1 | +1 | +1 | -1 | +1 | -1 | 0 | +1 |
| C2 | +1 | -1 | +1 | +1 | -1 | 0 | +1 |
| C3 | -1 | +1 | +1 | +1 | -1 | 0 | +1 |
| C4 | -1 | +1 | +1 | 0 | +1 | -1 | +1 |
| C5 | +1 | +1 | -1 | -1 | 0 | +1 | +1 |
| C6 | +1 | -1 | +1 | -1 | 0 | +1 | +1 |
| C7 | -1 | +1 | +1 | -1 | 0 | +1 | +1 |
| C8 | 0 | +1 | 0 | 0 | +1 | -1 | +1 |
| C9 | 0 | 0 | +1 | +1 | -1 | 0 | +1 |
| CA | 0 | +1 | 0 | +1 | -1 | 0 | +1 |
| CB | +1 | 0 | 0 | +1 | -1 | 0 | +1 |
| CC | +1 | 0 | 0 | 0 | +1 | -1 | +1 |
| CD | 0 | 0 | +1 | -1 | 0 | +1 | +1 |
| CE | 0 | +1 | 0 | -1 | 0 | +1 | +1 |
| CF | +1 | 0 | 0 | -1 | 0 | +1 | +1 |

| 8bit Data | 6T Data | | | | | | Total |
|---|---|---|---|---|---|---|---|
| D0 | +1 | -1 | +1 | 0 | -1 | +1 | +1 |
| D1 | +1 | +1 | -1 | -1 | +1 | 0 | +1 |
| D2 | +1 | -1 | +1 | -1 | +1 | 0 | +1 |
| D3 | -1 | +1 | +1 | -1 | +1 | 0 | +1 |
| D4 | -1 | +1 | +1 | 0 | -1 | +1 | +1 |
| D5 | +1 | +1 | -1 | +1 | 0 | -1 | +1 |
| D6 | +1 | -1 | +1 | +1 | 0 | -1 | +1 |
| D7 | -1 | +1 | +1 | +1 | 0 | -1 | +1 |
| D8 | 0 | +1 | 0 | 0 | -1 | +1 | +1 |
| D9 | 0 | 0 | +1 | -1 | +1 | 0 | +1 |
| DA | 0 | +1 | 0 | -1 | +1 | 0 | +1 |
| DB | +1 | 0 | 0 | -1 | +1 | 0 | +1 |
| DC | +1 | 0 | 0 | 0 | -1 | +1 | +1 |
| DD | 0 | 0 | +1 | +1 | 0 | -1 | +1 |
| DE | 0 | +1 | 0 | +1 | 0 | -1 | +1 |
| DF | +1 | 0 | 0 | +1 | 0 | -1 | +1 |

| 8bit Data | 6T Data | | | | | | Total |
|---|---|---|---|---|---|---|---|
| E0 | +1 | -1 | 0 | +1 | +1 | -1 | +1 |
| E1 | 0 | +1 | -1 | +1 | -1 | +1 | +1 |
| E2 | +1 | -1 | 0 | +1 | -1 | +1 | +1 |
| E3 | -1 | 0 | +1 | +1 | -1 | +1 | +1 |
| E4 | -1 | 0 | +1 | +1 | +1 | -1 | +1 |
| E5 | 0 | +1 | -1 | -1 | +1 | +1 | +1 |
| E6 | +1 | -1 | 0 | -1 | +1 | +1 | +1 |
| E7 | -1 | 0 | +1 | -1 | +1 | +1 | +1 |
| E8 | -1 | +1 | 0 | +1 | +1 | -1 | +1 |
| E9 | 0 | -1 | +1 | +1 | -1 | +1 | +1 |
| EA | -1 | +1 | 0 | +1 | -1 | +1 | +1 |
| EB | +1 | 0 | -1 | +1 | -1 | +1 | +1 |
| EC | +1 | 0 | -1 | +1 | +1 | -1 | +1 |
| ED | 0 | -1 | +1 | -1 | +1 | +1 | +1 |
| EE | -1 | +1 | 0 | -1 | +1 | +1 | +1 |
| EF | +1 | 0 | -1 | -1 | +1 | +1 | +1 |

| 8bit Data | 6T Data | | | | | | Total |
|---|---|---|---|---|---|---|---|
| F0 | +1 | -1 | 0 | 0 | 0 | +1 | +1 |
| F1 | 0 | +1 | -1 | 0 | +1 | 0 | +1 |
| F2 | +1 | -1 | 0 | 0 | +1 | 0 | +1 |
| F3 | -1 | 0 | +1 | 0 | +1 | 0 | +1 |
| F4 | -1 | 0 | +1 | 0 | 0 | +1 | +1 |
| F5 | 0 | +1 | -1 | +1 | 0 | 0 | +1 |
| F6 | +1 | -1 | 0 | +1 | 0 | 0 | +1 |
| F7 | -1 | 0 | +1 | +1 | 0 | 0 | +1 |
| F8 | -1 | +1 | 0 | 0 | 0 | +1 | +1 |
| F9 | 0 | -1 | +1 | 0 | +1 | 0 | +1 |
| FA | -1 | +1 | 0 | 0 | +1 | 0 | +1 |
| FB | +1 | 0 | -1 | 0 | +1 | 0 | +1 |
| FC | +1 | 0 | -1 | 0 | 0 | +1 | +1 |
| FD | 0 | -1 | +1 | +1 | 0 | 0 | +1 |
| FE | -1 | +1 | 0 | +1 | 0 | 0 | +1 |
| FF | +1 | 0 | -1 | +1 | 0 | 0 | +1 |

EYE PATTERN (8B6T)

FREQUENCY SPECTRUM (8B6T)

SIGNAL WAVEFORM (8B6T+CLK)

FREQUENCY SPECTRUM (8B6T+CLK)

SIGNAL WAVEFORM (1/50 CLK SUPERIMPOSED)

FREQUENCY SPECTRUM (1/50 CLK SUPERIMPOSED)

FIG. 18A

CONVERSION TABLE (6-BIT DATA → QUATERNARY SYMBOL × 4)

| 6bit Data | 4Q Data | | | | Total | 6bit Data | 4Q Data | | | | Total |
|---|---|---|---|---|---|---|---|---|---|---|---|
| 0 | +0.5 | +1.5 | −1.5 | −0.5 | 0 | 22 | +1.5 | +0.5 | −1.5 | −0.5 | 0 |
| 1 | −1.5 | +0.5 | +0.5 | +0.5 | 0 | 23 | −1.5 | +1.5 | +0.5 | −0.5 | 0 |
| 2 | −1.5 | +1.5 | +1.5 | −1.5 | 0 | 24 | +0.5 | −1.5 | −0.5 | +1.5 | 0 |
| 3 | −1.5 | +0.5 | +1.5 | −0.5 | 0 | 25 | +0.5 | −0.5 | +0.5 | −0.5 | 0 |
| 4 | −1.5 | −0.5 | +1.5 | +0.5 | 0 | 26 | +0.5 | −0.5 | −1.5 | +1.5 | 0 |
| 5 | +1.5 | −1.5 | +0.5 | −0.5 | 0 | 27 | −0.5 | −0.5 | −0.5 | +1.5 | 0 |
| 6 | −0.5 | −0.5 | +0.5 | +0.5 | 0 | 28 | −1.5 | −1.5 | +1.5 | +1.5 | 0 |
| 7 | −0.5 | +0.5 | −1.5 | +1.5 | 0 | 29 | +0.5 | −1.5 | +0.5 | +0.5 | 0 |
| 8 | +0.5 | −1.5 | +1.5 | −0.5 | 0 | 30 | +0.5 | +1.5 | −0.5 | −1.5 | 0 |
| 9 | +1.5 | −0.5 | −1.5 | +0.5 | 0 | 31 | −0.5 | +1.5 | −0.5 | −0.5 | 0 |
| 10 | −1.5 | +0.5 | −0.5 | +1.5 | 0 | 32 | +1.5 | −1.5 | −0.5 | +0.5 | 0 |
| 11 | +1.5 | +1.5 | −1.5 | −1.5 | 0 | 33 | −0.5 | −1.5 | +0.5 | +1.5 | 0 |
| 12 | +1.5 | −0.5 | +0.5 | −1.5 | 0 | 34 | +0.5 | −0.5 | −0.5 | +0.5 | 0 |
| 13 | −0.5 | −0.5 | +1.5 | −0.5 | 0 | 35 | −0.5 | +0.5 | +0.5 | −0.5 | 0 |
| 14 | +1.5 | −0.5 | −0.5 | −0.5 | 0 | 36 | −1.5 | +1.5 | −1.5 | +1.5 | 0 |
| 15 | −1.5 | +1.5 | −0.5 | +0.5 | 0 | 37 | −0.5 | +0.5 | +1.5 | −1.5 | 0 |
| 16 | +0.5 | +0.5 | −0.5 | −0.5 | 0 | 38 | +0.5 | +0.5 | −1.5 | +0.5 | 0 |
| 17 | −1.5 | −0.5 | +0.5 | +1.5 | 0 | 39 | −0.5 | −1.5 | +1.5 | +0.5 | 0 |
| 18 | −0.5 | +1.5 | +0.5 | −1.5 | 0 | 40 | +1.5 | −1.5 | −1.5 | +1.5 | 0 |
| 19 | +0.5 | −0.5 | +1.5 | −1.5 | 0 | 41 | +0.5 | +0.5 | +0.5 | −1.5 | 0 |
| 20 | +1.5 | +0.5 | −0.5 | −1.5 | 0 | 42 | −0.5 | +0.5 | −0.5 | +0.5 | 0 |
| 21 | +1.5 | −1.5 | +1.5 | −1.5 | 0 | 43 | −0.5 | +1.5 | −1.5 | +0.5 | 0 |

} TABLE-A

FIG. 18B

CONVERSION TABLE (6-BIT DATA → QUATERNARY SYMBOL × 4)

| 6bit Data | 4Q Data | | | | Total |
|---|---|---|---|---|---|
| 44 | −0.5 | +0.5 | −0.5 | +1.5 | +1 |
| 45 | −0.5 | +0.5 | +0.5 | +0.5 | +1 |
| 46 | +0.5 | −1.5 | +1.5 | +0.5 | +1 |
| 47 | +0.5 | +0.5 | +0.5 | −0.5 | +1 |
| 48 | +1.5 | −0.5 | +0.5 | −0.5 | +1 |
| 49 | +0.5 | +0.5 | −1.5 | +1.5 | +1 |
| 50 | −0.5 | +1.5 | −0.5 | +0.5 | +1 |
| 51 | −0.5 | +0.5 | +1.5 | −0.5 | +1 |
| 52 | −1.5 | +0.5 | +0.5 | +1.5 | +1 |
| 53 | +0.5 | −1.5 | +0.5 | +1.5 | +1 |
| 54 | +0.5 | +1.5 | +0.5 | −1.5 | +1 |
| 55 | −1.5 | +1.5 | −0.5 | +1.5 | +1 |
| 56 | +0.5 | −0.5 | +1.5 | −0.5 | +1 |
| 57 | +0.5 | +1.5 | −0.5 | −0.5 | +1 |
| 58 | +0.5 | +1.5 | −1.5 | +0.5 | +1 |
| 59 | +1.5 | +1.5 | −1.5 | −0.5 | +1 |
| 60 | +1.5 | +0.5 | +0.5 | −1.5 | +1 |
| 61 | +1.5 | −0.5 | +1.5 | −1.5 | +1 |
| 62 | +1.5 | −1.5 | +1.5 | −0.5 | +1 |
| 63 | −1.5 | +1.5 | +0.5 | +0.5 | +1 |

TABLE-B

EYE PATTERN (6B4Q)

FREQUENCY SPECTRUM (6B4Q)

SIGNAL WAVEFORM (1/50 CLK SUPERIMPOSED)

FREQUENCY SPECTRUM (1/50 CLK SUPERIMPOSED)

EYE PATTERN
(6B4Q + DC BALANCE COMPENSATION, CODING RATE=150%)

FREQUENCY SPECTRUM
(6B4Q + DC BALANCE COMPENSATION, CODING RATE=150%)

EYE PATTERN
(8B5Q + DC BALANCE COMPENSATION, CODING RATE=160%)

FREQUENCY SPECTRUM
(8B5Q + DC BALANCE COMPENSATION, CODING RATE=160%)

ENCODING APPARATUS, INFORMATION PROCESSING APPARATUS, ENCODING METHOD, AND DATA TRANSMISSION METHOD

BACKGROUND OF THE INVENTION

1. Field of the Invention

The present invention relates to an encoding apparatus, an information processing apparatus, an encoding method, and a data transmission method.

2. Description of the Related Art

Most information processing apparatuses such as mobile phone and notebook personal computer (hereinafter, a notebook PC) use a movable member for a hinge portion connecting a main body to be operated by a user and a display portion on which information is displayed. However, a large number of signal lines and power lines pass through the hinge portion, and a method for maintaining reliability of the wiring is desired. Reducing the number of the signal lines passing through the hinge portion comes first to mind. Therefore, data transmission processing between the main body and the display portion is made to be performed by using a serial transmission method instead of a parallel transmission method. As such, if the serial transmission method is used, the number of signal lines is decreased.

In the serial transmission method, data is encoded and then transmitted. At that time, for example, a Non Return to Zero (NRZ) encoding scheme, a Manchester encoding scheme, an Alternate Mark Inversion (AMI) encoding scheme, or the like is used as the encoding scheme. For example, JP-A-1991-109843 discloses a technology for transmitting data by using an AMI code, which is a representative example of a bipolar code. The patent document also discloses a technology according to which a data clock is transmitted after being expressed by an intermediate value of a signal level, and the receiving side regenerates the data clock based on the signal level.

SUMMARY OF THE INVENTION

However, in an information processing apparatus such as a notebook PC, even if the serial transmission method using the above code is used, the number of signal lines wired in the hinge portion is still large. For example, in a case of a notebook PC, there are wiring lines related to an LED backlight for illuminating an LCD in addition to video signals to be transmitted to the display portion, and thus several tens of signal lines including these signal lines are wired in the hinge portion. The LCD is an abbreviation for Liquid Crystal Display, and the LED is an abbreviation for Light Emitting Diode.

Therefore, the inventor of the present invention has developed an encoding scheme (hereinafter, a new scheme) according to which a DC component is not included and according to which a clock component can be easily extracted from a received signal. Since a transmission signal generated based on this new scheme does not include a DC component, it can be transmitted by being superimposed on a DC power. Furthermore, by detecting the polarity inversion cycle of the transmission signal, a clock can be regenerated by the receiving side without using a PLL. Therefore, a plurality of signal lines can be bound together, and thereby the number of signal lines can be reduced and also the power consumption and the circuit scale can be reduced. The PLL is an abbreviation for Phase Locked Loop.

Now, in recent years, the resolution of the LCD is greatly enhanced as applications are diversified. Accordingly, together with the reduction of power consumption as described above, speeding up of transmission speed is also a large issue. The speeding up of transmission speed can be realized by simply speeding up the clock. However, if the clock is sped up in a serial transmission line, the frequency spectrum of the transmission signal becomes wide, resulting in electromagnetic interference (EMI) to the mobile phone or the like. Also, speeding up of the clock will increase the power consumption.

Therefore, an encoding method that is capable of transmitting more data with the same clock is desired. Also, in case of transmitting the transmission signal by superimposing the same on a DC power as described above, the signal is transmitted through a transmission line having DC cutoff characteristics. Accordingly, an encoding method that is capable of generating a transmission signal with good DC balance is preferable.

In light of the foregoing, it is desirable to provide an encoding apparatus, an information processing apparatus, an encoding method, and a data transmission method, which are new and improved, and which are capable of increasing the transmission speed without widening the frequency spectrum, while maintaining a high transmission quality even in a transmission line having DC cutoff characteristics.

According to an embodiment of the present invention, there is provided an encoding apparatus which includes an encoding unit that generates encoded data formed from a sequence of base-k data in which m pieces (m<n) of base-k symbols are combined, by converting input binary data in units of n bits based on a specific conversion rule that associates n-bit binary data and the base-k data. In case a DC balance of the base-k data obtained after conversion has a polarity, the encoding unit controls a polarity of a symbol included in the base-k data obtained after conversion such that the polarity of the DC balance of the base-k data obtained after conversion is different from a polarity of a DC balance of a sequence of base-k data previous to the base-k data obtained after conversion.

Among the n-bit binary data, K pieces of the binary data may be associated with the base-k data having a DC balance of zero and $(2^n-K)$ pieces of the binary data may be associated with the base-k data having a positive DC balance, according to the specific conversion rule. In case the DC balance of the base-k data obtained after conversion is positive, if a sequence of base-k data located previous to the base-k data obtained after conversion has a positive DC balance, the encoding unit may reverse a sign of a symbol included in the base-k data obtained after conversion.

The encoding apparatus may further include a storage unit that stores a first conversion table that associates K pieces of the binary data with the base-k data having a DC balance of zero, according to the specific conversion rule, a second conversion table that associates $(2^n-K)$ pieces of the binary data with the base-k data having a positive DC balance, according to the specific conversion rule, and a third conversion table that associates the $(2^n-K)$ pieces of the binary data with base-k data having a negative DC balance, the base-k data having a negative DC balance being obtained by reversing signs of m symbols included in the base-k data having a positive DC balance.

In case the binary data that is to be converted corresponds to the $(2^n-K)$ pieces of the binary data, if a sequence of base-k data previous to base-k data to be obtained by converting the binary data that is to be converted has a positive DC balance in a sequence of the base-k data, the encoding unit may convert the binary data that is to be converted by using the third conversion table, and if the sequence of the base-k data previous to the base-k data to be obtained by converting the binary data that is to be converted has a negative DC balance, the encoding unit may convert the binary data that is to be converted by using the second conversion table.

Any one of (k, m, n)=(3, 6, 8), (4, 4, 6) and (4, 5, 8) may be adopted as a combination of the k, m, and n.

According to another embodiment of the present invention, there is provided an encoding apparatus which includes an encoding unit that generates encoded data formed from a sequence of base-k data in which m pieces (m<n) of base-k symbols are combined, by converting input binary data in units of n bits based on a specific conversion rule that associates n-bit binary data and the base-k data. The specific conversion rule is a conversion rule that associates the binary data and the base-k data whose DC balance is zero.

Either of (k, m, n)=(4, 5, 6) and (3, 7, 8) may be adopted as a combination of the k, m, and n.

According to another embodiment of the present invention, there is provided an information processing apparatus which includes a first module that includes an encoding unit that generates encoded data by converting input binary data in units of n bits based on a specific conversion rule that associates n-bit binary data and base-k data in which m pieces (m<n) of base-k symbols are combined, and by controlling, in case a DC balance of the base-k data obtained after conversion has a polarity, a polarity of a symbol included in the base-k data obtained after conversion such that the polarity of the DC balance of the base-k data obtained after conversion is different from a polarity of a DC balance of a sequence of base-k data previous to the base-k data obtained after conversion, and a data transmitting unit that transmits the encoded data generated by the encoding unit, and a second module that includes a data receiving unit that receives the encoded data transmitted from the first module, and a decoding unit that detects the polarity of the DC balance of each of the base-k data included in the encoded data received by the data receiving unit, and decodes the encoded data based on the polarity of the DC balance of each of the base-k data that has been detected and based on the specific conversion rule.

Among the n-bit binary data, K pieces of the binary data may be associated with the base-k data having a DC balance of zero and ($2^n$−K) pieces of the binary data may be associated with the base-k data having a positive DC balance, according to the specific conversion rule. In case the DC balance of the base-k data obtained after conversion is positive, if a sequence of base-k data previous to the base-k data obtained after conversion has a positive DC balance, the encoding unit may reverse signs of m symbols included in the base-k data obtained after conversion. The decoding unit may decode the encoded data based on the specific conversion rule after reversing a sign of each symbol included in base-k data for which a negative DC balance is detected.

The first module may further include a storage unit that stores a first conversion table that associates K pieces of the binary data with the base-k data having a DC balance of zero, according to the specific conversion rule, a second conversion table that associates ($2^n$−K) pieces of the binary data with the base-k data having a positive DC balance, according to the specific conversion rule, and a third conversion table that associates the ($2^n$−K) pieces of the binary data with base-k data having a negative DC balance, the base-k data having a negative DC balance being obtained by reversing signs of m symbols included in the base-k data having a positive DC balance.

In case the binary data that is to be converted corresponds to the ($2^n$−K) pieces of the binary data, if a sequence of base-k data previous to base-k data to be obtained by converting the binary data that is to be converted has a positive DC balance in a sequence of the base-k data, the encoding unit may convert the binary data that is to be converted by using the third conversion table, and if the sequence of the base-k data previous to the base-k data to be obtained by converting the binary data that is to be converted has a negative DC balance, the encoding unit may convert the binary data that is to be converted by using the second conversion table.

The second module may further include a storage unit the stores the first conversion table, the second conversion table, and the third conversion table. Furthermore, the decoding unit may decode the encoded data by using the first conversion table for base-k data for which a DC balance of zero is detected, by using the second conversion table for base-k data for which a positive DC balance is detected, and by using the third conversion table for base-k data for which a negative DC balance is detected.

The first module may further include a clock addition unit that synchronously adds, to the encoded data, a clock having an amplitude value larger than a maximum value for the symbol and having a speed half a symbol speed. The second module may further include a clock regeneration unit that detects a cycle of polarity inversion of an amplitude of the encoded data received by the data receiving unit and that regenerates the clock based on the detection result. The decoding unit may decode the encoded data by using the clock regenerated by the clock regeneration unit.

The first module and the second module may be connected by a specific signal line. The data transmitting unit may generate a superimposed signal by superimposing a power signal supplied from a DC power supply on the encoded data, and may transmit the superimposed signal through the specific signal line. The data receiving unit may receive the superimposed signal through the specific signal line, and may separate the power signal and the encoded data from the superimposed signal.

The first module may further include an arithmetic processing unit that outputs at least display data. The second module may further include a display unit that displays the display data. The encoding unit may generate encoded data by converting binary data corresponding to the display data output from the arithmetic processing unit into a sequence of the base-k data. The decoding unit may restore the binary data corresponding to the display data by decoding the encoded data, and may input the binary data to the display unit.

According to another embodiment of the present invention, there is provided an information processing apparatus which includes a first module that includes an encoding unit that generates encoded data by converting input binary data in units of n bits based on a specific conversion rule that associates n-bit binary data and base-k data in which m pieces (m<n) of base-k symbols are combined in such a way that a DC balance becomes zero, and a data transmitting unit that transmits the encoded data generated by the encoding unit, and a second module that includes a data receiving unit that receives the encoded data transmitted from the first module, and a decoding unit that decodes the encoded data received by the data receiving unit, based on the specific conversion rule.

Either of (k, m, n)=(4, 5, 6) and (3, 7, 8) may be adopted as a combination of the k, m, and n.

According to another embodiment of the present invention, there is provided an encoding method which includes the step of generating encoded data formed from a sequence of base-k data in which m pieces (m<n) of base-k symbols are combined, by converting input binary data in units of n bits based on a specific conversion rule that associates n-bit binary data and the base-k data. In case a DC balance of the base-k data obtained after conversion has a polarity, a polarity of a symbol included in the base-k data obtained after conversion is controlled in the step of generating encoded data such that the polarity of the DC balance of the base-k data obtained after conversion is different from a polarity of a DC balance of a sequence of base-k data previous to the base-k data obtained after conversion.

According to another embodiment of the present invention, there is provided an encoding method which includes the step of generating encoded data formed from a sequence of base-k data in which m pieces (m<n) of base-k symbols are combined in such a way that a DC balance becomes zero, by converting input binary data in units of n bits based on a specific conversion rule that associates n-bit binary data and the base-k data.

According to another embodiment of the present invention, there is provided a data transmission method which includes the steps of generating encoded data by converting input binary data in units of n bits based on a specific conversion rule that associates n-bit binary data and base-k data in which m pieces (m<n) of base-k symbols are combined, and by controlling, in case a DC balance of the base-k data obtained after conversion has a polarity, a polarity of a symbol included in the base-k data obtained after conversion such that the polarity of the DC balance of the base-k data obtained after conversion is different from a polarity of a DC balance of a sequence of base-k data previous to the base-k data obtained after conversion, transmitting the encoded data generated in the step of generating encoded data, receiving the encoded data transmitted in the step of transmitting the encoded data, detecting the polarity of the DC balance of each of the base-k data included in the encoded data received in the step of receiving the encoded data, and decoding the encoded data based on the polarity of the DC balance of each of the base-k data that has been detected in the step of detecting the polarity of the DC balance and based on the specific conversion rule.

According to another embodiment of the present invention, there is provided a data transmission method which includes the steps of generating encoded data by converting input binary data in units of n bits based on a specific conversion rule that associates n-bit binary data and base-k data in which m pieces (m<n) of base-k symbols are combined in such a way that a DC balance becomes zero, transmitting the encoded data generated in the step of generating encoded data, receiving the encoded data transmitted in the step of transmitting the encoded data, and decoding the encoded data received in the step of receiving the encoded data, based on the specific conversion rule.

According to the embodiments of the present invention described above, it is possible to increase transmission speed without widening a frequency spectrum, while maintaining a high transmission quality even in a transmission line having DC cutoff characteristics.

BRIEF DESCRIPTION OF THE DRAWINGS

FIG. 6 is an explanatory diagram showing an example of a transmission signal (multilevel code) generation method and an amplitude determination method according to the new scheme;

FIG. 12 is an explanatory diagram showing an addition method of a control bit for DC balance control according to the embodiment;

FIG. 13A is an explanatory diagram showing an example of an 8B6T conversion table;

FIG. 13B is an explanatory diagram showing an example of an 8B6T conversion table;

FIG. 13C is an explanatory diagram showing an example of an 8B6T conversion table;

FIG. 13D is an explanatory diagram showing an example of an 8B6T conversion table;

FIG. 18A is an explanatory diagram showing an example of a 6B4Q conversion table;

FIG. 18B is an explanatory diagram showing an example of a 6B4Q conversion table;

DETAILED DESCRIPTION OF THE EMBODIMENT(S)

Figure 1:
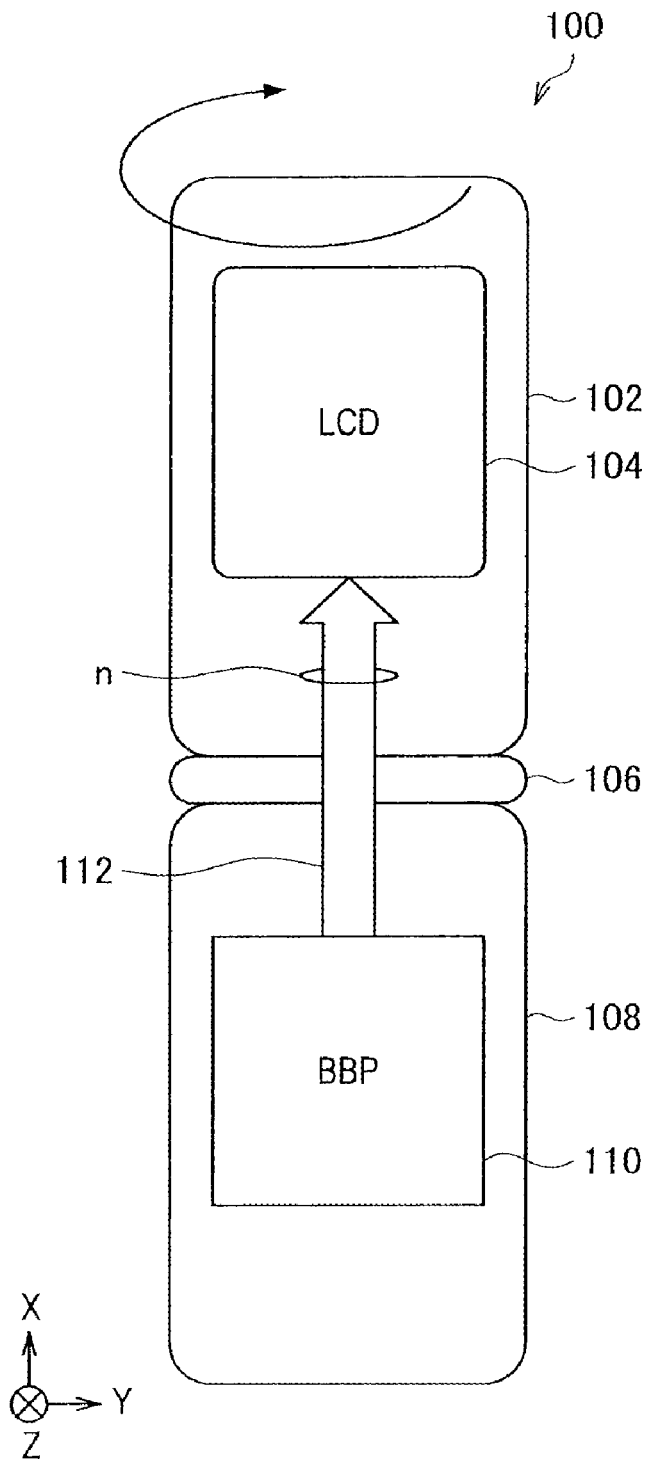
FIG. 1 is an explanatory diagram showing a configuration example of a mobile terminal adopting a parallel transmission scheme.

Hereinafter, preferred embodiments of the present invention will be described in detail with reference to the appended drawings. Note that, in this specification and the appended drawings, structural elements that have substantially the same function and structure are denoted with the same reference numerals, and repeated explanation of these structural elements is omitted.

<Flow of Description>

The flow of a description of an embodiment of the present invention described below will be briefly mentioned here. First, a device configuration of a mobile terminal 100 adopting a parallel transmission scheme will be described with reference to FIG. 1. Here, a demerit relating to the parallel transmission scheme will be pointed out. Then, a device configuration of a mobile terminal 130 adopting a serial transmission scheme will be described with reference to FIG. 2. Then, a functional configuration of a general mobile terminal 130 will be described with reference to FIG. 3. Here, a brief description of the characteristics of an AMI code will be made with reference to FIG. 4. Then, the functional configuration of the mobile terminal 130 adopting an encoding method according to the new scheme described above will be described with reference to FIG. 5. Then, the encoding method according to the new scheme described above will be described with reference to FIG. 6. Furthermore, the eye pattern and the frequency spectrum of a multilevel code generated by the encoding method of the new scheme will be described with reference to FIGS. 7 and 8.

Next, an encoding method according to the present embodiment will be described with reference to FIG. 9. Here, a method of encoding by 8B6T conversion will be briefly described with reference to FIGS. 13A to 13D. Furthermore, an explanation will be given, with reference to FIG. 10, on the frequency spectrum of a multilevel code obtained by superimposing a clock on a code generated based on the encoding method shown in FIG. 9. Here, the characteristics of the code generated based on the encoding method shown in FIG. 9 and the characteristics of the multilevel code obtained by the superimposition of a clock will be briefly described with reference to FIGS. 14A to 16B.

Next, the functional configuration of a mobile terminal 200 according to the present embodiment will be described with reference to FIG. 11. Then, the structure of a transmission frame used at the time of transmission of the transmission signal of the present embodiment will be briefly described with reference to FIG. 12. Then, the functional configuration of a mobile terminal 300 according to a first modified example of the present embodiment will be described with reference to FIG. 17. Furthermore, an encoding method according to the modified example will be described with reference to FIGS. 18A and 18B.

Furthermore, the characteristics of a code generated by the encoding method according to the modified example and the characteristics of a multilevel code obtained by superimposition of a clock will be briefly described with reference to FIGS. 19A to 21B. Then, an encoding method according to a second modified example of the present embodiment and the characteristics of a code generated by the encoding method will be described with reference to FIGS. 22A and 22B. Lastly, the technical idea of the embodiment will be summarized and operational effects obtained by the technical idea will be briefly described.

(Description Items)

1: Introduction
   1-1: Configuration of Mobile Terminal 100 (Parallel Transmission Scheme)
   1-2: Configuration of Mobile Terminal 130 (Serial Transmission Scheme)
   1-3: Configuration of Mobile Terminal 130 (New Scheme)
2: Embodiment
   2-1: Encoding Method
      2-1-1: Encoding Method of 8B6T Conversion Scheme
      2-1-2: Encoding Method of Extended 8B6T Conversion Scheme
   2-2: Configuration of Mobile Terminal 200 (Extended 8B6T Conversion Scheme)
3: Modified Examples
   3-1: (First Modified Example) Extended 6B4Q Conversion Scheme
      3-1-1: Encoding Method of Extended 6B4Q Conversion Scheme
      3-1-2: Configuration of Mobile Terminal 300 (Extended 6B4Q Conversion Scheme)
   3-2: (Second Modified Example) Extended 8B5Q Conversion Scheme
4: Summary

1: INTRODUCTION

In the following, a detailed explanation will be given on the technology according to an embodiment of the present invention. But before giving the explanation, issues to be solved by the embodiment will be briefly described with reference to concrete examples.

1-1: Configuration of Mobile Terminal 100 (Parallel Transmission Scheme)

First, a device configuration of a mobile terminal 100 adopting a parallel transmission scheme will be briefly described with reference to FIG. 1. FIG. 1 is an explanatory diagram showing an example of the device configuration of the mobile terminal 100 adopting a parallel transmission scheme. In FIG. 1, a mobile phone is schematically illustrated as an example of the mobile terminal 100. However, the application scope of the technology described below is not limited to a mobile phone. For example, it can be applied to an information processing apparatus such as a notebook PC or various portable electronic devices.

As shown in FIG. 1, the mobile terminal 100 mainly includes a display unit 102, a liquid crystal unit 104 (LCD), a connecting unit 106, an operation unit 108, a baseband processor 110 (BBP), and a parallel signal path 112. The LCD is an abbreviation for Liquid Crystal Display.

Additionally, the display unit 102 and the operation unit 108 may be respectively referred to as a display side and a main body side. Additionally, for the sake of explanation, a case where an image signal is transmitted through the parallel signal path 112 will be described as an example. Of course, the type of a signal to be transmitted through the parallel signal path 112 is not limited to such, and it may also be a control signal, an audio signal, or the like, for example.

As shown in FIG. 1, the liquid crystal unit 104 is provided on the display unit 102. The image signal transmitted through the parallel signal path 112 is input to the liquid crystal unit 104. The liquid crystal unit 104 displays an image based on the input image signal. Also, the connecting unit 106 is a member connecting the display unit 102 and the operation unit 108. The connecting member forming the connecting unit 106 has a structure that enables the display unit 102 to rotate 180 degrees in a Z-Y plane, for example. The connecting member can also be formed such that the display unit 102 can rotate in an X-Z plane. In this case, the mobile terminal 100 will have a structure capable of folding. Additionally, the connecting member may also have a structure that allows the display unit 102 to move freely in any direction.

The baseband processor 110 is a computational processing unit that provides the mobile terminal 100 with a communication control function and an application execution function. A parallel signal that is output from the baseband processor 110 is transmitted through the parallel signal path 112 to the liquid crystal unit 104 of the display unit 102. The parallel signal path 112 is provided with a plurality of signal lines. In the case of a mobile phone, for example, the number n of the signal lines is approximately fifty lines. The image signal transmission speed is approximately 130 Mbps in a case where the resolution of the liquid crystal unit 104 is QVGA. The parallel signal path 112 is wired such that the lines pass through the connecting unit 106.

In other words, the plurality of signal lines that form the parallel signal path 112 are provided in the connecting unit 106. As described above, if the range of movement of the connecting unit 106 is increased, the risk increases that the movement will inflict damage on the parallel signal path 112. This would result in impairment of the reliability of the parallel signal path 112. On the other hand, if the reliability of the parallel signal path 112 is maintained, the range of movement of the connecting unit 106 will be restricted. It is for this reason that the serial transmission scheme has come to be widely used in mobile phones and the like in order to maintain the reliability of the parallel signal path 112 while also increasing the degree of freedom of the movable member that forms the connecting unit 106.

1-2: Configuration of Mobile Terminal 130 (Serial Transmission Scheme)

Figure 2:
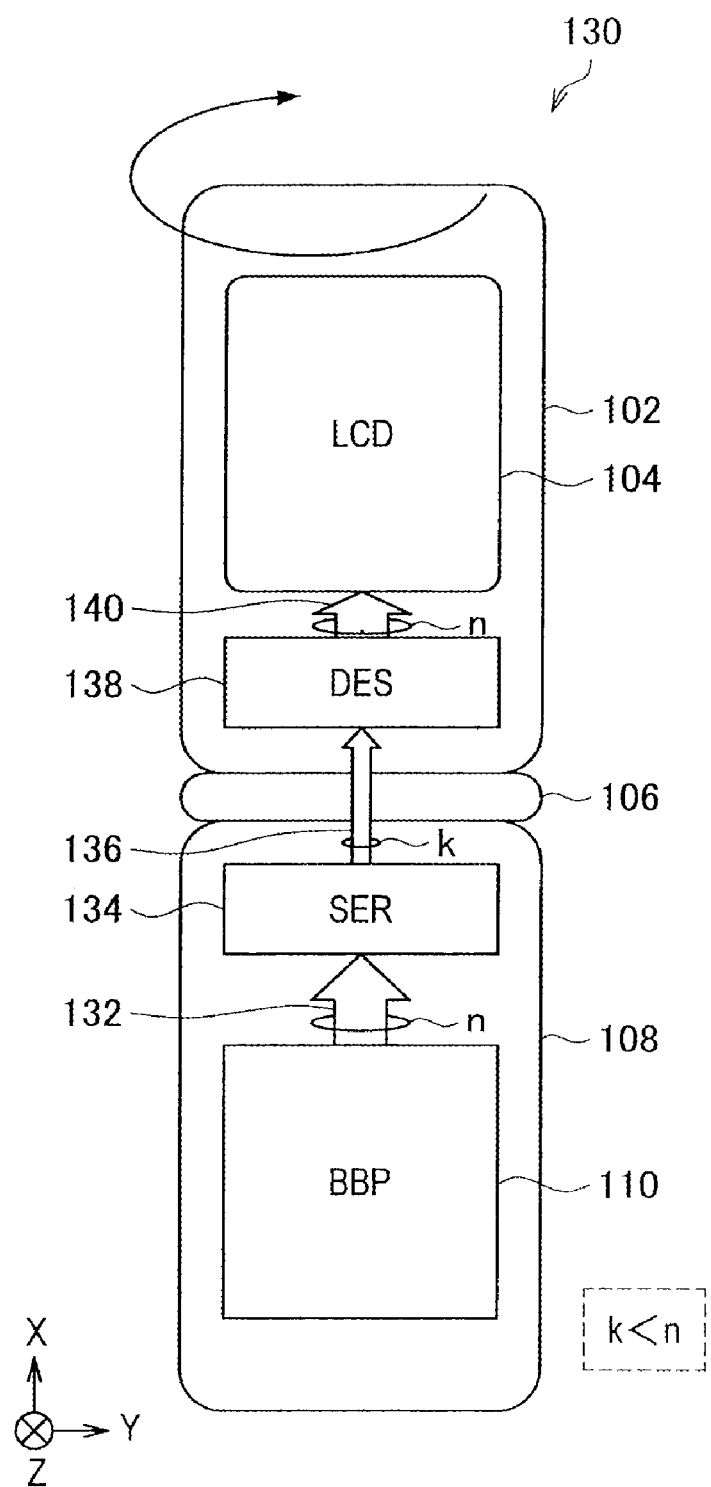
FIG. 2 is an explanatory diagram showing a configuration example of a mobile terminal adopting a serial transmission scheme.

Now, a device configuration of a mobile terminal 130 adopting the serial transmission scheme will be briefly described with reference to FIG. 2. FIG. 2 is an explanatory diagram showing an example of the device configuration of the mobile terminal 130 adopting the serial transmission scheme.

In FIG. 2, a mobile phone is schematically illustrated as an example of the mobile terminal 130. However, the application scope of the technology described below is not limited to a mobile phone. For example, it can be applied to an information processing apparatus such as a notebook PC or various portable electronic devices. Furthermore, structural elements having functions substantially the same as those of the mobile terminal 100 of the parallel transmission scheme shown in FIG. 1 will be denoted with the same reference numerals, and detailed explanation of these structural elements will be omitted.

As shown in FIG. 2, the mobile terminal 130 mainly includes the display unit 102, the liquid crystal unit 104 (LCD), the connecting unit 106, and the operation unit 108. Also, the mobile terminal 130 includes the baseband processor 110 (BBP), parallel signal paths 132, 140, a serializer 134, a serial signal path 136, and a deserializer 138.

Unlike the mobile terminal 100 that is described above, the mobile terminal 130 transmits the image signal by the serial transmission scheme through the serial signal path 136 that is wired through the connecting unit 106. Therefore, the serializer 134 is provided in the operation unit 108 to serialize the parallel signal that is output from the baseband processor 110. On the other hand, the deserializer 138 is provided in the display unit 102 to parallelize the serial signal that is transmitted through the serial signal path 136.

The serializer 134 converts the parallel signal that is output from the baseband processor 110 and input through the parallel signal path 132 into a serial signal. The serial signal that has been converted by the serializer 134 is input to the deserializer 138 through the serial signal path 136. When the serial signal is input, the deserializer 138 restores the original parallel signal from the input serial signal. Then, the deserializer 138 inputs the parallel signal to the liquid crystal unit 104 through the parallel signal path 140.

In the serial signal path 136, a data signal that is encoded by the NRZ encoding scheme, for example, may be transmitted on its own, or alternatively, the data signal and a clock signal may be transmitted together. The number k of the lines in the serial signal path 136 is significantly less than the number n of the lines in the parallel signal path 112 in the mobile terminal 100 in FIG. 1 ($1 \leq k \ll n$). For example, the number k of the lines can be reduced to only a few lines.

Therefore, the degree of freedom relating to the movable range of the connecting unit 106 through which the serial signal path 136 passes can be said to be very much greater than that of the connecting unit 106 through which the parallel signal path 112 passes. At the same time, it can also be said that the reliability of the serial signal path 136 is high. Additionally, a differential signal such as a LVDS (Low Voltage Differential Signal) or the like is ordinarily used for the serial signal that flows through the serial signal path 136.

Heretofore, the device configuration of the mobile terminal 130 has been briefly described. The overall device configuration of the mobile terminal 130 adopting the serial transmission scheme is approximately as described above. However, how much the number of signal lines in the connecting unit 106 can be reduced depends on the form of the signal flowing through the serial signal path 136. The serializer 134 and the deserializer 138 are to determine the form of this signal. In the following, functional configurations of the serializer 134 and the deserializer 138 in a general serial transmission scheme will be briefly described. Afterwards, functional configurations of the serializer 134 and the deserializer 138 according to the above-described new scheme will be described.

(General Configuration)

Figure 3:
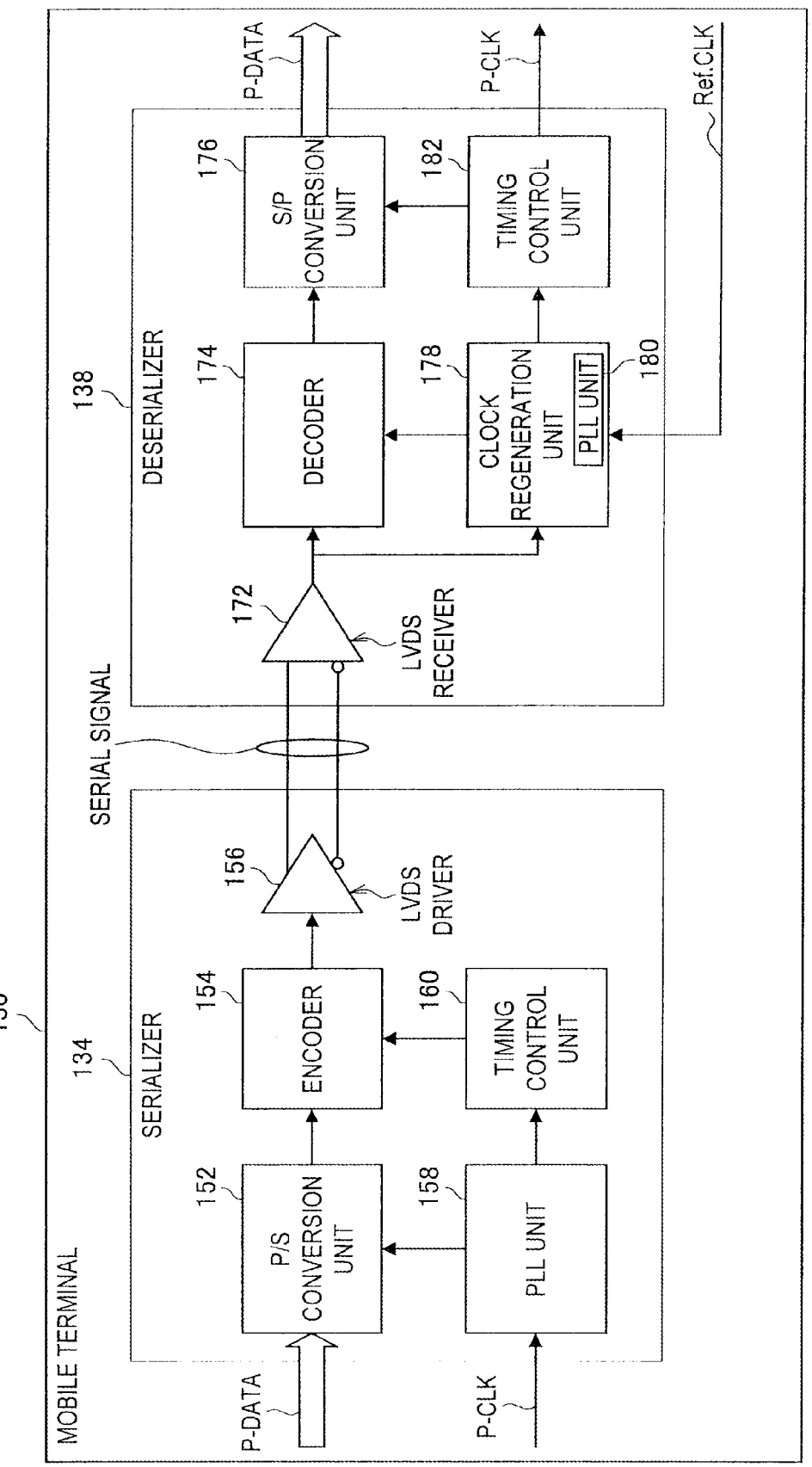
FIG. 3 is an explanatory diagram showing a functional configuration example of a mobile terminal adopting a general serial transmission scheme.

Here, a functional configuration of the mobile terminal 130 adopting a general serial transmission scheme will be described with reference to FIG. 3. FIG. 3 is an explanatory diagram showing a functional configuration example of the mobile terminal 130 adopting a general serial transmission scheme. However, it should be noted that FIG. 3 is an explanatory diagram mainly illustrating the functional configurations of the serializer 134 and the deserializer 138, and that description of other structural elements are omitted.

(Serializer 134)

As shown in FIG. 3, the serializer 134 includes a P/S conversion unit 152, an encoder 154, an LVDS driver 156, a PLL unit 158, and a timing control unit 160.

A parallel signal (P-DATA) and a parallel signal clock (P-CLK) are input from the baseband processor 110 to the serializer 134. The parallel signal that is input to the serializer 134 is converted into a serial signal by the P/S conversion unit 152. The serial signal that has been converted by the P/S conversion unit 152 is input to the encoder 154. The encoder 154 adds a header and the like to the serial signal and inputs it to the LVDS driver 156. The LVDS driver 156 transmits the input serial signal to the deserializer 138 by a differential transmission scheme according to LVDS.

In contrast, the parallel signal clock that is input to the serializer 134 is input to the PLL unit 158. The PLL unit 158 generates a serial signal clock from the parallel signal clock and inputs it to the P/S conversion unit 152 and to the timing control unit 160. The timing control unit 160 controls the timing of the transmission of the serial signal by the encoder 154, based on the serial signal clock that is input.

(Deserializer 138)

For its part, the deserializer 138 mainly includes, as shown in FIG. 3, an LVDS receiver 172, a decoder 174, an S/P conversion unit 176, a clock regeneration unit 178, a PLL unit 180, and a timing control unit 182.

The serial signal is transmitted to the deserializer 138 from the serializer 134 by the differential transmission scheme according to LVDS. The serial signal is received by the LVDS receiver 172. The serial signal that is received by the LVDS receiver 172 is input to the decoder 174 and to the clock regeneration unit 178. The decoder 174 detects the beginning portion of the data by referring to the header of the input serial signal and inputs the signal to the S/P conversion unit 176. The S/P conversion unit 176 converts the input serial signal into the parallel signal (P-DATA). The parallel signal that has been converted by the S/P conversion unit 176 is output to the liquid crystal unit 104.

For its part, the clock regeneration unit 178 uses the built-in PLL unit 180 to regenerate the parallel signal clock from the serial signal clock by referring to a reference clock (Ref-.CLK) that is input from the outside. The parallel signal clock that has been regenerated by the clock regeneration unit 178 is input to the decoder 174 and to the timing control unit 182. The timing control unit 182 controls the receiving timing based on the parallel signal clock that is input from the clock regeneration unit 178. The parallel signal clock (P-CLK) that is input to the timing control unit 182 is output to the liquid crystal unit 104.

In this manner, the parallel signal (P-DATA) and the parallel signal clock (P-CLK) that are input to the serializer 134 from the baseband processor 110 are converted into the serial signals and are transmitted to the deserializer 138. The input serial signals are then restored by the deserializer 138 to the original parallel signal and the original parallel signal clock. The parallel signal and the parallel signal clock that have been restored are input to the liquid crystal unit 104. In case the parallel signal is an image signal, an image is displayed by the liquid crystal unit 104 based on the input parallel signal.

Heretofore, a general functional configuration of the mobile terminal 130 adopting the serial transmission scheme has been described. As described above, the transmission line is serialized by converting the parallel signal into the serial signal and transmitting the serial signal. The range of movement of the portion through which the serial signal path passes is enlarged as a result, and the degree of freedom in the disposition of the display unit 102 is increased.

For example, in a case where the mobile terminal 130 is used to watch and listen to a television broadcast or the like, it is possible to transform the mobile terminal 130 such that the display unit 102 is disposed in a landscape orientation from the user's point of view. The increase in the degree of freedom brings with it a wider range of uses for the mobile terminal 130, such that, in addition to various types of communication terminal functions, a wide variety of uses becomes possible as a terminal having functions of a video player, a music player and the like.

Additionally, the above example describes a method of serializing a data signal such as an image signal and transmitting the same. Here, in addition to the transmission line for the data signal, at least a power line is provided in the connecting unit 106 of the mobile terminal 130. In particular, break in the power line will cause a serious damage, and it is extremely important to improve its reliability. Also, the restriction imposed on the range of movement of the connecting unit 106 greatly differs for a case where the number of the transmission lines is 1 and for a case where it is 2 or more.

Thus, a scheme has been devised according to which the data signal is transmitted being superimposed on a power signal. This scheme is for encoding the data signal into a code form that does not include a DC component, such as an AMI code (see FIG. 4) and a Manchester code, and transmitting the data signal by superimposing the same on a power signal. Using this method will enable to reduce the number of the transmission lines in the connecting unit 106 by the number of the power lines. Depending on the circumstances, power supply and data transmission can be realized by using one coaxial cable, thereby enabling to greatly reduce the risk of break in the power line and also to significantly increase the degree of freedom of transformation of the mobile terminal 130.

(Summary of Issues 1)

As explained above, a parallel transmission scheme like that of the mobile terminal 100 that is described above is not well suited to freely change the positional relationship of the operation unit 108 and the display unit 102. In relation to this issue, a method has been proposed to provide the serializer 134 and the deserializer 138, as in the mobile terminal 130 that is described above, to make serial transmission possible and increase the range of movement of the display unit 102. Also, to further improve the movability of the display unit 102, a scheme has been proposed to superimpose a signal on the power line and transmit the signal, by taking the advantage of the characteristics of a code not including a DC component.

However, the PLL unit 180 (hereinafter, PLL) is provided in the mobile terminal 130 shown in FIG. 3 to regenerate the clock of a received serial signal. This PLL is necessary to extract a clock from a signal which has been encoded according to the Manchester encoding scheme or the like. However, the amount of power consumption by the PLL is not negligible to a small electronic device. Accordingly, to promote energy saving, a measure is desired to cut down on the power consumption by the PLL.

In view of such issue, the inventor of the present invention has devised a code which does not include a DC component and for which a PLL is not necessary at the time of clock regeneration so that a PLL will not have to be provided at the deserializer 138, and proposes a novel transmission scheme (new scheme) of transmitting a signal by using this code. Hereunder, this new scheme will be described. Additionally, although a concrete explanation is attempted in relation to an encoding method of the new scheme for which the AMI code serves as a base, the encoding method to be the application target of the new scheme is not limited to the AMI code.

1-3: Configuration of Mobile Terminal 130 (New Scheme)

First, the AMI code will be briefly described. Then, the functional configuration of the mobile terminal 130 according to the new scheme and the encoding method of such mobile terminal 130 will be described.

(Signal Waveform of AMI Code)

Figure 4:
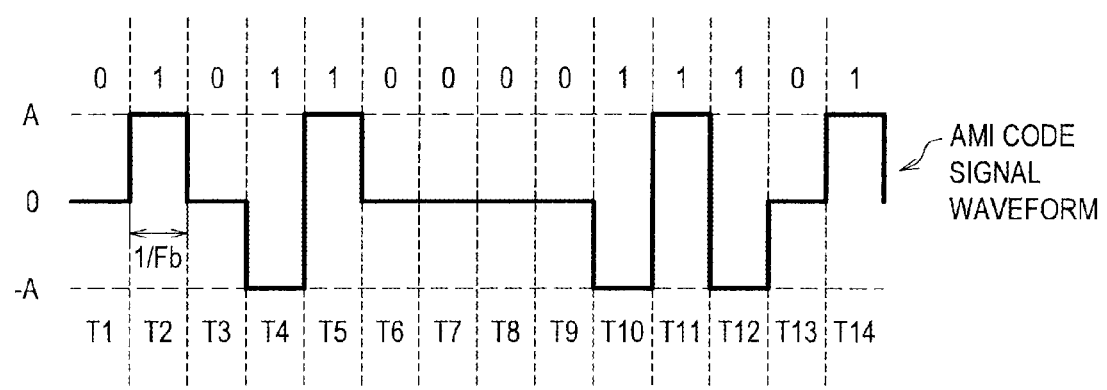
FIG. 4 is an explanatory diagram showing a signal waveform of an AMI code.

First, the signal waveform of the AMI code and the characteristics of the AMI code will be briefly described with reference to FIG. 4. FIG. 4 is an explanatory diagram showing an example of the signal waveform of the AMI code. The AMI code is a code that uses an electrical potential of zero to express a data value of zero and potentials of A and −A to express a data value of 1 (A is any positive number). Note, however, that the potential A and the potential −A are used alternately. That is, after a data value of 1 has been expressed by the potential A, if the next data bit is also a 1, that 1 will be expressed by the potential −A. Because the data values are expressed by repeatedly inverting the polarity in this manner, the AMI code will be a code that hardly contains DC components.

Other codes with the same type of characteristics as the AMI code include, for example, the partial response code that expresses the data as PR (1, −1), PR (1, 0, −1), PR (1, 0, . . . , −1), and the like. Transmission codes that use this sort of polarity inversion are called bipolar codes. Alternatively, a dicode code, a biphase code, or the like, can also be used for the encoding method of the new scheme described later. Note that, in the following explanation, an encoding method based on an AMI code with a duty of 100% will be described as an example.

FIG. 4 schematically shows the AMI code of periods T1 to T14. In the drawing, a data value 1 appears at timings T2, T4, T5, T10, T11, T12, and T14. If the potential is A at timing T2, the potential at timing T4 is −A. Also, the potential at timing T5 is A. As such, the amplitude corresponding to the data value 1 is alternately inverted between positive and negative values. This is the polarity inversion. In contrast, a data value 0 is expressed by a potential 0 at all times.

This form of expression allows the AMI code to be a code that hardly contains DC components. However, as can be seen at timings T6 to T9, there may appear a section where a potential of 0 occurs consecutively, depending on the combination of data. The consecutive potentials of 0 make it difficult to extract the clock component from the signal waveform without using a PLL. That is, it becomes necessary to provide a PLL at the receiving side. Accordingly, the inventor of the present invention has devised a method (encoding method of the new scheme) of superimposing a clock on the AMI code (or a code having equivalent characteristics) before transmitting the same.

(Functional Configuration of Mobile Terminal 130)

Figure 5:
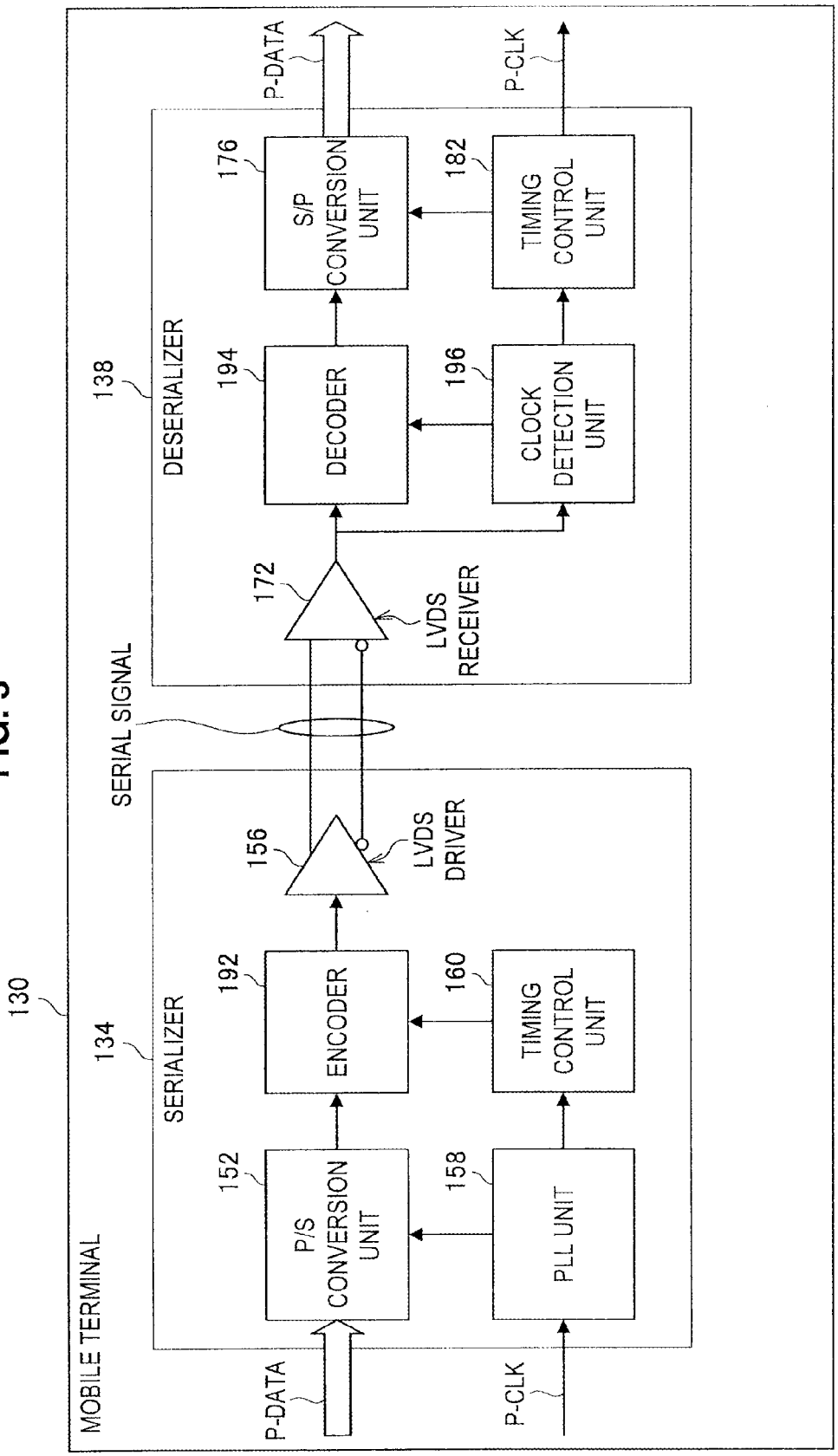
FIG. 5 is an explanatory diagram showing a functional configuration example of a mobile terminal according to a new scheme.

Hereunder, the functional configuration of the mobile terminal 130 according to the new scheme will be described with reference to FIG. 5. FIG. 5 is an explanatory diagram showing an example of the functional configuration of the mobile terminal 130 according to the new scheme. However, it should be noted that FIG. 5 is an explanatory diagram mainly illustrating the functional configurations of the serializer 134 and the deserializer 138, and that description of other structural elements are omitted. Also, structural elements having functions of the mobile terminal 130 described above will be denoted with the same reference numerals, and detailed explanation of these structural elements will be omitted.

(Serializer 134)

First, the serializer 134 will be described. As shown in FIG. 5, the serializer 134 is configured from the P/S conversion unit 152, the LVDS driver 156, the PLL unit 158, the timing control unit 160, and an encoder 192. The main point of difference from the general configuration described earlier is in the function of the encoder 192.

As shown in FIG. 5, the parallel signal (P-DATA) and the parallel signal clock (P-CLK) are input from the baseband processor 110 to the serializer 134. The parallel signal that is input to the serializer 134 is converted into a serial signal by the P/S conversion unit 152. The serial signal that has been converted by the P/S conversion unit 152 is input to the encoder 192. The encoder 192 adds a header and the like to the serial signal and generates a transmission frame. Furthermore, the encoder 192 encodes the generated transmission frame by the encoding method of the new scheme described later, and generates a transmission signal.

Next, a method of generating the encoded signal in the encoder 192 will be described with reference to FIG. 6. FIG. 6 is an explanatory diagram showing an example of the encoding method of the new scheme. Additionally, FIG. 6 illustrates a method of generating a code for which the AMI code serves as a base. However, the type of the code that can be used for the encoding method of the new scheme is not limited to such, and other code having equivalent characteristics as the AMI code can be similarly used. For example, the encoding method of the new scheme can be applied to the bipolar code, the partial response code, and the like.

The code waveform that is shown in (C) of FIG. 6 has been generated by the encoding method of the new scheme. This code waveform has been obtained by expressing a data value 1 by a plurality of potentials A1 (−1, −3, 1, 3) and a data value 0 by a plurality of potentials A2 (−2, 2) that are different from the potentials A1. The characteristics of this code waveform are that the polarities are inverted every half cycle of the clock and that the same potential does not occur consecutively. For example, referring to the section where data values 0 occur consecutively in timings T6 to T9, the potentials are −2, 2, −2, 2. Accordingly, even if the same data values occur consecutively, the clock component can be detected without using a PLL by detecting both the rising and the falling edges of the amplitude.

Such code waveform is obtained by a method of synchronously adding a clock as shown in (B) of FIG. 6 to a code waveform of an AMI code as shown in (A) of FIG. 6, for example. The encoder 192 includes an adder ADD to realize this method. First, the encoder 192 encodes a serial signal that is input into an AMI code, and generates a code waveform of an AMI code as shown in (A) of FIG. 6. Next, the encoder 192 inputs the code waveform of the AMI code that has been generated to the adder ADD. Furthermore, the encoder 192 generates a clock as shown in (B) of FIG. 6, and inputs the same to the adder ADD.

Here, as shown in (B) of FIG. 6, the clock has a frequency (Fb/2) half that of the transmission speed Fb of the AMI code. Furthermore, the amplitude of the clock is N times that of the AMI code (N>1; N=2 in the example in FIG. 6). As described, by adding together the AMI code and the clock having an amplitude larger than the amplitude of the AMI code, a code waveform whose amplitude crosses zero every half cycle of the clock, as shown in (C) of FIG. 6, can be obtained. At this time, the AMI code and the clock are synchronously added with their edges aligned. The code waveform (the transmission signal) of the new scheme is generated by the encoder 192 in this manner.

Figure 7:
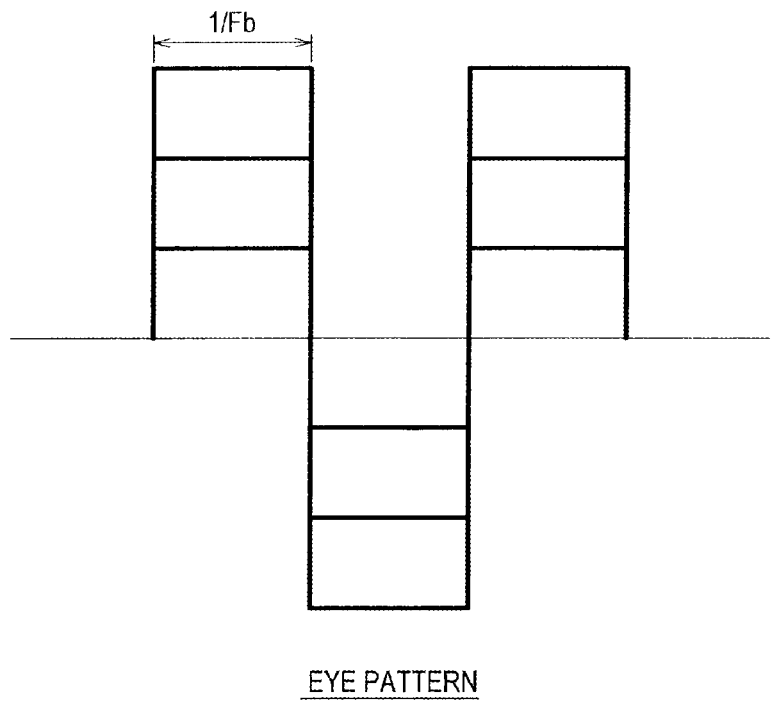
FIG. 7 is an explanatory diagram showing an example of an ideal eye pattern of a multilevel code (six levels)
Figure 8:
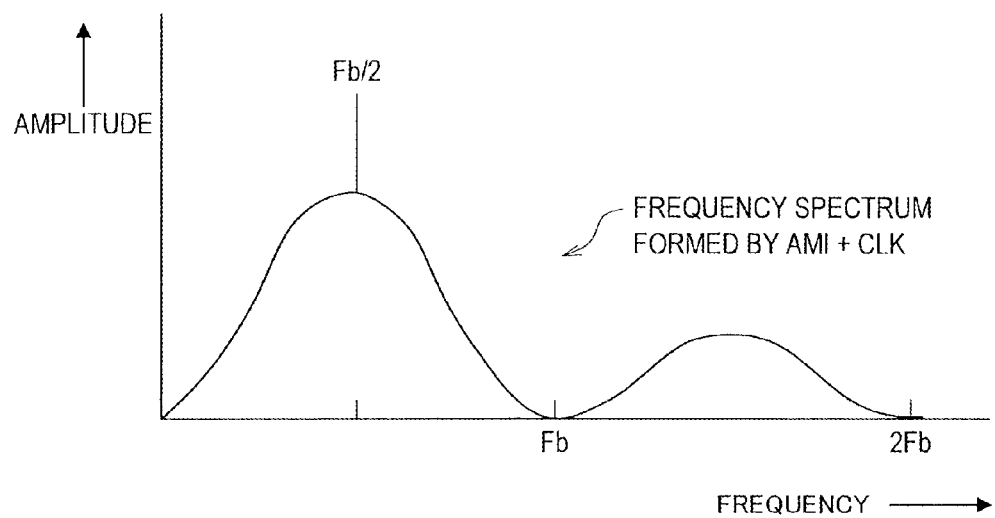
FIG. 8 is an explanatory diagram showing an example of a frequency spectrum of a multilevel code for which the AMI code serves as a base.

Additionally, the code waveform of the new scheme has a plurality of amplitude levels for one data value. For example, the code waveform of the new scheme illustrated in (C) of FIG. 6 may take six values, 3, 2, 1, −1, −2, and −3, as the amplitude level. Among these, 2 and −2 correspond to a data value 0, and 3, 1, −1, and −3 correspond to a data value 1. That is, the code of the new scheme is a multilevel code (a six-level code in the example of FIG. 6). Accordingly, the eye pattern of the code waveform of the new scheme will take a form with six levels as shown in FIG. 7. Also, the frequency spectrum of the code waveform of the new scheme will take a form as shown in FIG. 8. As described above, the code of the new scheme contains the clock component, and thus the frequency spectrum also includes a line spectrum at the position of clock frequency Fb/2.

Heretofore, the encoding method of the encoder 192 and the characteristics of the code waveform generated by the encoder 192 have been described. Additionally, to simplify the explanation, a method has been described here of generating the code waveform of the new scheme by synchronously adding the AMI code and the clock. However, there is also a method of directly encoding data into the code waveform of the new scheme based on a specific coding rule. For example, in the example of FIG. 6, amplitude levels 2, −1, 2, −3, 3, −2, . . . , −1 are determined from a data sequence 0, 1, 0, 1, 1, 0, . . . , 1 based on a specific coding rule, and the code waveform of the new scheme is generated based on the determination result.

FIG. 5 will be again referred to. The serial signal that has been encoded by the encoder 192 in the manner described above is input to the LVDS driver 156. The LVDS driver 156 transmits the input serial signal to the deserializer 138 by a differential transmission scheme according to LVDS. On the other hand, a parallel signal clock input to the serializer 134 is input to the PLL unit 158.

The PLL unit 158 generates a serial signal clock from the parallel signal clock, and inputs the serial signal clock to the P/S conversion unit 152 and the timing control unit 160. The timing control unit 160 controls the timing of the transmission of the serial signal by the encoder 192, based on the input serial signal clock. As described above, a serial signal is transmitted from the serializer 134 to the deserializer 138.

(Deserializer 138)

Next, the deserializer 138 will be described. As shown in FIG. 5, the deserializer 138 is mainly configured from the LVDS receiver 172, the S/P conversion unit 176, the timing control unit 182, a clock detection unit 196, and a decoder 194. The main point of difference from the general configuration described above is in the presence of the clock detection unit 196, which does not have a PLL.

As described above, the serial signal is transmitted from the serializer 134 to the deserializer 138 by the differential transmission scheme according to LVDS. This serial signal is received by the LVDS receiver 172. The serial signal received by the LVDS receiver 172 is input to the decoder 194 and the clock detection unit 196. The decoder 194 detects the beginning portion of the data by referring to the header of the input serial signal and decodes the serial signal that was encoded by the encoder 192.

Here, the method of decoding by the decoder 194 will be described by referring again to FIG. 6. As described above, the serial signal is encoded by the encoder 192 into a code waveform having six amplitude levels. Thus, the decoder 194 performs threshold determination with a plurality of threshold levels as references, and compares each amplitude level. Then, by converting each amplitude level obtained by the threshold determination into the original data, the decoder 194 decodes the serial signal that has been encoded by the encoder 192.

For example, by using four threshold values (L1, L2, L3, L4) that are shown in (C) of FIG. 6, amplitude level A1 (−1, −3, 1, 3), which corresponds to the data value 1, and amplitude level A2 (−2, 2), which corresponds to the data value 0 can be distinguished from each other. The decoder 194 first compares the amplitude level of the input signal with the four threshold values described above and determines whether the amplitude level is A1 or A2. Then, the decoder 194 decodes the serial signal that has been encoded by the encoder 192, by outputting a data value 1 at a timing the amplitude level is determined to be A1 and by outputting a data value 0 at a timing the amplitude level is determined to be A2.

FIG. 5 will be again referred to. The serial signal that has been restored by the decoder 194 in this manner is input to the S/P conversion unit 176. The S/P conversion unit 176 converts the input serial signal into the parallel signal (P-DATA). The parallel signal that has been converted by the S/P conversion unit 176 is input to the liquid crystal unit 104. In case the parallel signal is an image signal, an image is displayed by the liquid crystal unit 104 based on the image signal.

Now, a clock becomes necessary to perform the above-described decoding process. This clock is supplied by the clock detection unit 196. Here, the clock detection unit 196 detects the clock component in the signal received by the LVDS receiver 172, and regenerates the original clock by using the clock component. As has already been explained, the code waveform of the new scheme is obtained by synchronously adding a clock to the AMI code, and the polarity is inverted every half cycle of the clock. Thus, the clock component is extracted by detecting the timing of the amplitude level of a received signal crossing zero. That is, the clock detection unit 196 can regenerate the clock without using a PLL. Accordingly, a PLL does not have to be provided, and the power consumption and the circuit scale of the deserializer 138 can be reduced to that extent.

The clock detection unit 196 regenerates the original clock by using the clock component detected from the received signal. Then, the clock regenerated by the clock detection unit 196 is input to the decoder 194 and the timing control unit 182. The clock input to the decoder 194 is used for the decoding process by the decoder 194. Furthermore, the timing control unit 182 controls a reception timing based on the clock input from the clock detection unit 196. Furthermore, the clock input to the timing control unit 182 is converted into the parallel signal clock (P-CLK), and is output toward the liquid crystal unit 104.

The threshold determination performed by the decoder 194 and the clock detection unit 196 described above is realized by using a comparator corresponding to each threshold value. For example, the clock component is extracted at the clock detection unit 196 based on the output result of a comparator having a threshold level L0. Also, to determine six amplitude levels, 3, 2, 1, −1, −2, and −3, a comparator with four threshold levels, L1 (2.5), L2 (1.5), L3 (−1.5), and L4 (−2.5), is used at the decoder 194. The amplitude levels are determined based on the output results of these comparators. Furthermore, the original NRZ data is restored based on these output results.

As described above, using a code which does not include a DC component and from which a clock component can be regenerated based on the polarity inversion cycle allows the deserializer 138 to perform clock detection without using a PLL, and thus the power consumption of the mobile terminal 130 can be greatly reduced. Additionally, the above-described example illustrates a differential transmission scheme according to LVDS. However, transmission is also possible by superimposing the code waveform of the new scheme on a power signal supplied from a DC power supply. According to this configuration, the range of movement of the connecting unit 106 can be further increased.

(Summary of Issues 2)

Heretofore, the functional configuration of the mobile terminal 130 according to the new scheme and the encoding/decoding method have been described. As described above, by using the encoding method according to the new scheme, the number of lines in the connecting unit 106 is greatly reduced, and also, significant effects such as the reduction in the circuit scale and in the power consumption amount can be obtained. As described above, the transmission signal generated by the encoding method of the new scheme is a multi-level signal expressing one bit value in a plurality of amplitude levels.

However, in the above-described example, an AMI code is used as a base for a multilevel code is used, and at the time of conversion to the AMI code, binary (base-2) data (NRZ data) is converted into ternary (base-3) data and the redundancy is increased. And in the case of the AMI code, the increase in the redundancy will not increase the transmission speed. Accordingly, the inventor of the present invention refined the encoding method that uses a multilevel code as a base, and devised a method of increasing the transmission speed.

2: EMBODIMENT

As has been described, to increase the transmission speed, it is enough simply to speed up the clock. However, if the clock is sped up, the frequency spectrum of the transmission signal flowing through the serial signal path becomes wide, and the influence of EMI increases. Also, the power consumption also increases along with the speeding up of the clock, and thus there is a limit to the speeding up of the clock. Accordingly, the present embodiment proposes an encoding method which is capable of increasing the transmission speed without widening the frequency spectrum of the transmission signal.

Note that a transmission signal in a transmission line having DC cutoff characteristics is assumed in the present embodiment, and thus a technology for increasing the transmission speed without deteriorating the transmission quality in such transmission line and without widening the frequency spectrum is desired. Furthermore, an encoding method is desired that is designed to reduce the power consumption and that allows the receiving side to regenerate the clock without using a PLL. The present embodiment proposes an encoding method that is capable of solving all these issues.

2-1: Encoding Method

The encoding method according to the present embodiment relates to an encoding method of converting binary data (for example, NRZ data) of n bits ($n \geq 2$) into m base-k symbols ($m < n$). Such encoding method is realized by using 8B6T conversion defined in IEEE 802.3u, for example. The 8B6T conversion is a conversion method of expressing 8-bit binary data by 6 ternary symbols. Accordingly, when using 8B6T conversion, the transmission speed can be increased by $4/3 = 1.33$ times without speeding up the clock.

However, the conversion rule of 8B6T conversion is configured from combinations according to which the DC balances of respective sets of 6 symbols are 0 and combinations according to which the DC balances are +1, and may result in most of the DC balances taking a positive value depending on the pattern of the binary data that is the encoding target. As a result, the transmission quality of the transmission signal encoded by 8B6T conversion may greatly deteriorate in a transmission line having DC cutoff characteristics. Therefore, the encoding method according to the present embodiment is refined to improve the transmission speed like 8B6T conversion defined in IEEE 802.3u, and also to improve the DC balance. In the following, this encoding method will be described in detail.

(2-1-1: Encoding Method of 8B6T Conversion Scheme)

First, 8B6T conversion defined in IEEE 802.3u will be described in detail with reference to FIGS. 13A to 13D. A category called 100BASE-T4 exists in Ethernet (registered trademark) standards, and is standardized as IEEE 802.3u. The code specified by IEEE 802.3u is called 8B6T (hereinafter, an 8B6T code). The 8B6T code is obtained by converting 8-bit binary data into 6 ternary symbols based on conversion tables specified by IEEE 802.3u (see FIGS. 13A to 13D).

For example, when using these conversion tables, 8-bit binary data 10001110 (8Eh) is converted into 0, +1, 0, −1, 0, 0. In this case, the DC balance (=0+1+0−1+0+0) of 6 symbols is 0. Similarly, when using these conversion tables, binary data 01011100 (5Ch) is converted into +1, +1, 0, −1, −1, +1. In this case, the DC balance (=1+1+0−1−1+1) of 6 symbols is +1. In these conversion tables, there are 134 combinations with a DC balance 0, and all the DC balances of the remaining 122 combinations are +1.

Accordingly, if these conversion tables are used, combinations resulting in a DC balance +1 may occur consecutively depending on the pattern of the binary data included in a data sequence to be encoded, and this results in significant imbalance of the DC balances of the 8B6T code sequence to the positive side. Such imbalance in the DC balances will significantly deteriorate a waveform in a low-frequency cutoff transmission line. As a result, determination error will increase at the time of determining each amplitude level at the receiving side, and the transmission quality will greatly deteriorate. Accordingly, the inventor of the present invention has extended the structure of the conversion table, and has devised an encoding method that is capable of improving the DC balance of an 8B6T code sequence (hereinafter, an extended 8B6T conversion scheme).

(2-1-2: Encoding Method of Extended 8B6T Conversion Scheme)

Here, an explanation will be given on an encoding method of the extended 8B6T conversion scheme according to the present embodiment with reference to FIG. 9. FIG. 9 is an explanatory diagram showing an encoding method of the extended 8B6T conversion scheme according to the present embodiment.

(Structure of Conversion Table)

Figure 9:
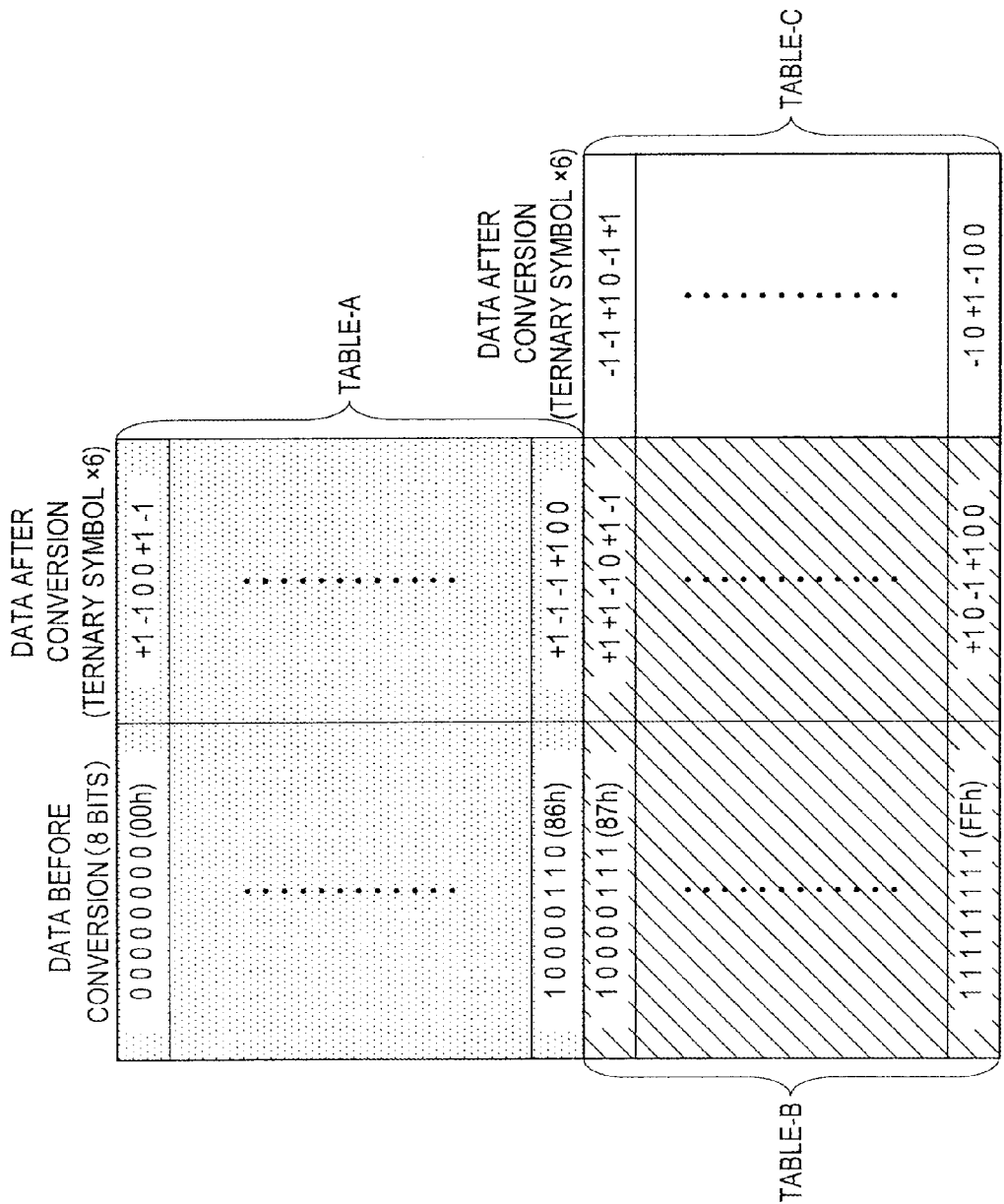
FIG. 9 is an explanatory diagram showing an example of an encoding method (8B6T) according to an embodiment of the present invention.

FIG. 9 shows an example of a conversion table that is used for the extended 8B6T conversion. In this conversion table, data before conversion, which is 8-bit binary data, and data after conversion, which is a combination of 6 ternary symbols, are described in association with each other. For example, data before conversion 10000110 (86h) is associated with data after conversion: +1, −1, −1, +1, 0, 0. Also, the conversion table shown in FIG. 9 is formed from 3 conversion tables (TABLE-A, TABLE-B, TABLE-C).

(TABLE-A)

TABLE-A is a list of combinations according to which the DC balance of the data after conversion will be 0. For example, TABLE-A is a conversion table for converting 0 to 134, among 8-bit binary data, into 6 ternary symbols. Furthermore, as the data after conversion of TABLE-A, a set of 6 symbols with a DC balance 0 that is selected from the conversion tables of IEEE 802.3u shown in FIGS. 13A to 13D is used, for example. Additionally, the manner of pairing the data before conversion and the data after conversion in TABLE-A is not limited to that shown as long as the DC balances of the data after conversion are all 0.

(TABLE-B)

TABLE-B is a list of combinations according to which the DC balance of the data after conversion will be +1. For example, TABLE-B is a conversion table for converting 135 to 255, among 8-bit binary data, into 6 ternary symbols. Furthermore, as the data after conversion of TABLE-B, a set of 6 symbols with a DC balance +1 that is selected from the conversion tables of IEEE 802.3u shown in FIGS. 13A to 13D is used, for example. Additionally, the manner of pairing the data before conversion and the data after conversion in TABLE-B is not limited to that shown as long as the DC balances of the data after conversion are all +1.

(TABLE-C)

TABLE-C is a list of combinations according to which the DC balance of the data after conversion will be −1. In TABLE-C, the polarity of each symbol of the data after conversion in TABLE-B is inverted. For example, if the data after conversion corresponding to data before conversion 10000111 (87h) is +1, +1, −1, 0, +1, −1 in TABLE-B, the data after conversion in TABLE-C will be −1, −1, +1, 0, −1, +1. That is, TABLE-C converts the polarity of a symbol of the data after conversion into a negative value in case the polarity has a positive value in TABLE-B, maintains the value 0, and converts the polarity into a positive value in case the polarity has a negative value in TABLE-B. With such polarity inversion performed, the DC balances of the data after conversion in TABLE-C will be −1.

(Encoding Method: Extended 8B6T Conversion)

The extended 8B6T conversion according to the present embodiment is for generating an 8B6T code sequence with a superior DC balance by using the above-described TABLE-A, TABLE-B and TABLE-C. Here, an encoding method based on the extended 8B6T conversion scheme will be described.

First, binary data which is the target of conversion (data before conversion) is input, and is converted, in units of 8 bits, into 6 ternary symbols (data after conversion) based on the conversion table shown in FIG. 9. At this time, the DC balance of the data after conversion is added to the DC balance of data after conversion that was converted in the past, and the result is maintained as the total of the past DC balance. Then, when converting the binary data that is input next, if the binary data is data that is described in TABLE-B or TABLE-C, the conversion table to be used (TABLE-B or TABLE-C) is selected according to the total of the past DC balance that is maintained.

(1) For example, in case the total of the past DC balance is +1 and the binary data which is the target of conversion is data described in TABLE-B or TABLE-C, the conversion process is performed by using TABLE-C. (2) Also, in case the total of the past DC balance is −1 and the binary data which is the target of conversion is data described in TABLE-B or TABLE-C, the conversion process is performed by using TABLE-B. (3) Furthermore, in case the total of the past DC balance is 0 and the binary data which is the target of conversion is data described in TABLE-B or TABLE-C, the conversion process may be performed by using either table. However, it is desirable that TABLE-B and TABLE-C are used alternately.

By encoding based on the coding rules of (1) to (3) described above, the DC balance of an 8B6T code sequence is compensated for at every conversion process, and the DC balance of the 8B6T code sequence is maintained in a good condition. Additionally, TABLE-C is the inversion of TABLE-B, and thus, instead of performing conversion by using TABLE-C, it is also possible to invert the polarities of the symbols of data after conversion that is obtained by converting by TABLE-B. With this structure, the data amount of a conversion table to be maintained can be reduced.

(Decoding Method: Extended 8B6T Reverse Conversion)

As described above, the encoding method according to the present embodiment switches the conversion table for data after conversion according to the DC balance of an 8B6T code sequence. Accordingly, at the time of decoding the 8B6T code sequence generated by the extended 8B6T conversion, a conversion table (TABLE-B or TABLE-C) to be used for extended 8B6T reverse conversion that is performed in units of 6 bits has to be appropriately selected. First, 6 symbols are sequentially read out from an input 8B6T code sequence, and the DC balance of each set of 6 symbols is calculated.

(1) In case the calculated DC balance of 6 symbols is +1, the extended 8B6T reverse conversion is performed by using TABLE-B, and 8-bit binary data is restored. (2) Also, in case the calculated DC balance of 6 symbols is −1, the extended 8B6T reverse conversion is performed by using TABLE-C, and 8-bit binary data is restored. (3) Furthermore, in case the calculated DC balance of 6 symbols is 0, the extended 8B6T reverse conversion is performed by using TABLE-A, and 8-bit binary data is restored. As such, the DC balance of 6 symbols is referred to at the time of decoding, and the conversion table to be used is appropriately selected according to the DC balance.

Heretofore, the encoding method of the extended 8B6T conversion scheme according to the present embodiment has been described. Also, the decoding method of an 8B6T code sequence generated by the encoding method of the extended 8B6T conversion scheme has also been described. By using the encoding method and the decoding method above, the transmission speed can be increased without deteriorating the transmission quality in the low-frequency cutoff transmission line. In the case of 8B6T conversion, 8-bit data is converted into an 8B6T code with 6 symbols, and the transmission speed can be increased by 8/6=1.33 times (for example, 500 Mbps→667 Mbps).

Figure 10:
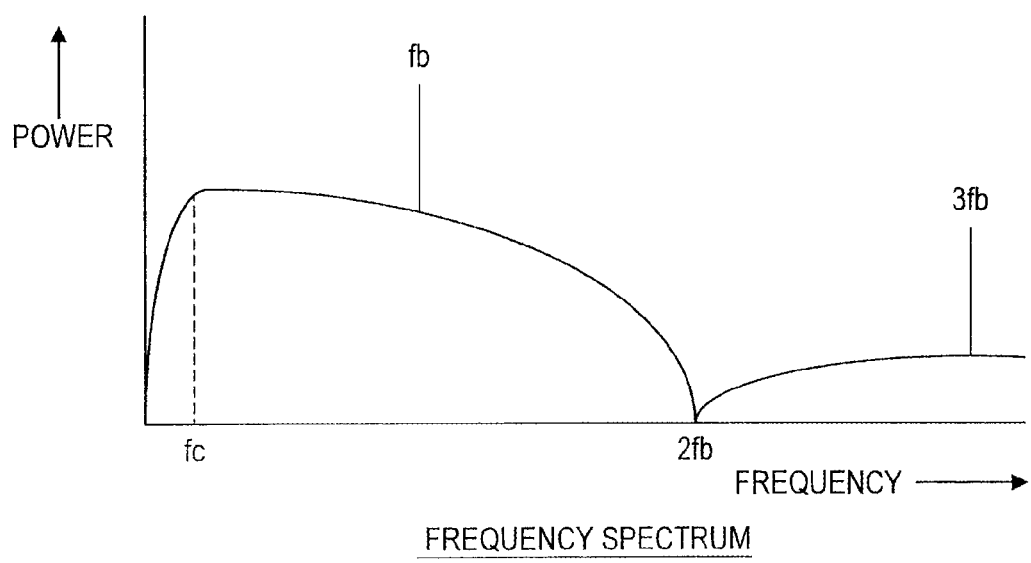
FIG. 10 is an explanatory diagram schematically showing a frequency spectrum of a multilevel code according to the embodiment.

Furthermore, the frequency spectrum of an 8B6T code sequence generated by the extended 8B6T conversion scheme will have a form as shown in FIG. 10. However, the frequency spectrum of FIG. 10 is that of a code sequence which is an 8B6T code sequence generated by the encoding method of the extended 8B6T conversion scheme to which a clock (CLK) having a frequency fb (fb=Fb/2), which is half that of the 8B6T code sequence, is synchronously added. Accordingly, there is a line spectrum at frequency fb.

When comparing the frequency spectrum of the AMI code (+CLK) shown in FIG. 8 and the frequency spectrum shown in FIG. 10, it can be seen that the frequency spectrum of the 8B6T code sequence generated by the extended 8B6T conversion scheme includes many low-frequency components with the low-frequency components decreasing drastically near the direct current. For example, in case the transmission speed is 500 Mbps (fb=250 MHz), the peak frequency fc appears at about 20 to 30 MHz. That is, the 8B6T code sequence generated by the extended 8B6T conversion scheme can be transmitted even in a transmission line that cuts off a direct current near the peak frequency fc.

Figure 14A:
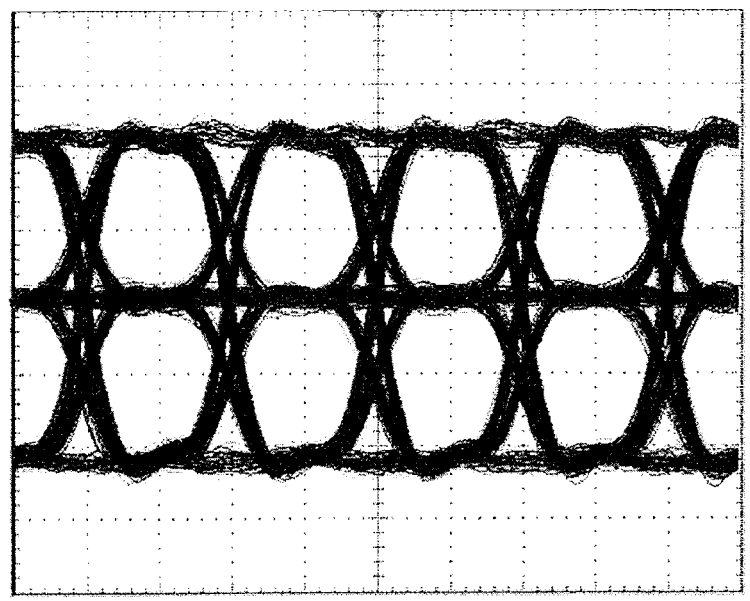
FIG. 14A is an explanatory diagram showing a concrete example of an eye pattern of an 8B6T converted code obtained by 8B6T conversion.
Figure 14B:
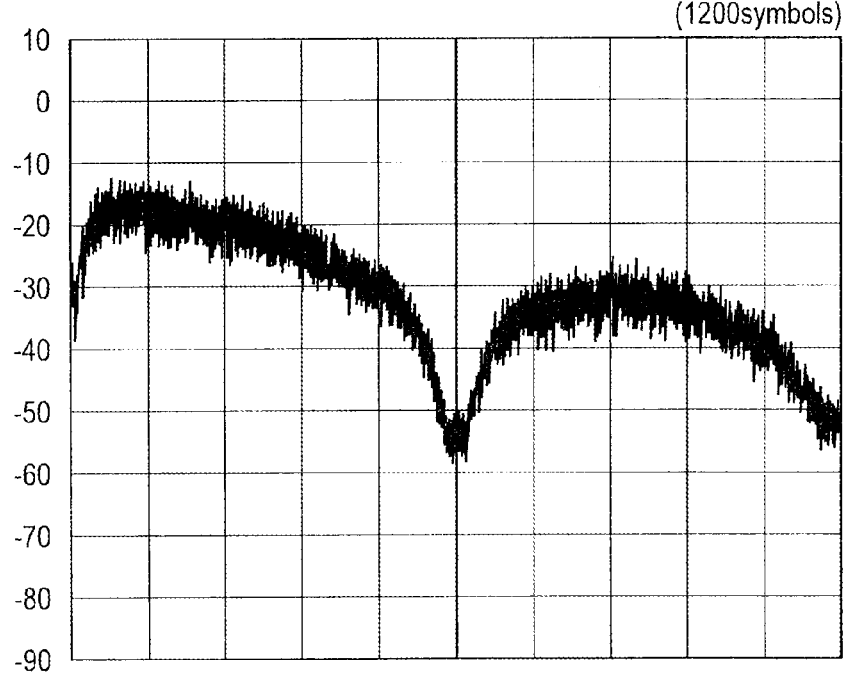
FIG. 14B is an explanatory diagram showing a concrete example of a frequency spectrum of the 8B6T converted code obtained by 8B6T conversion.
Figure 15A:
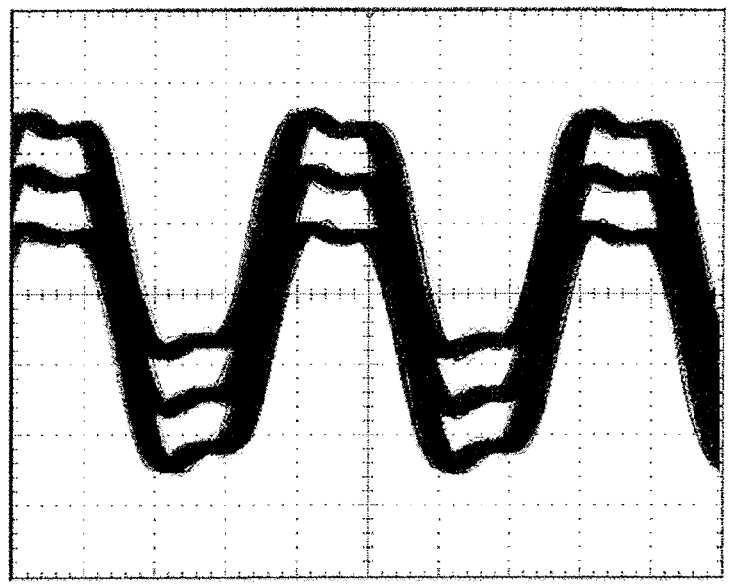
FIG. 15A is an explanatory diagram showing a concrete example of a signal waveform of a transmission signal obtained by superimposing a clock on the 8B6T converted code obtained by 8B6T conversion.

Additionally, the eye pattern, at the receiving side, of the 8B6T code sequence (transmission code) according to the extended 8B6T conversion scheme will take a form as shown in FIG. 14A. Also, the frequency spectrum of this transmission code will take a form as shown in FIG. 14B. Furthermore, the signal waveform, at the receiving side, of a multilevel code to which a clock having a frequency corresponding to half the transmission speed of this transmission code is synchronously added will be as shown in FIG. 15A. Also, the frequency spectrum of this multilevel code will be as shown in FIG. 15B.

Figure 15B:
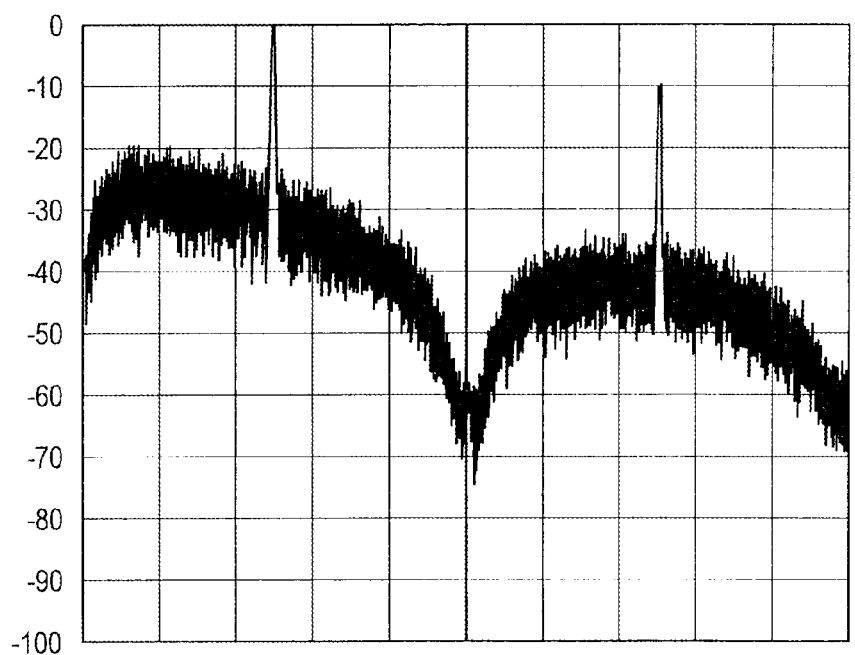
FIG. 15B is an explanatory diagram showing a concrete example of a frequency spectrum of the transmission signal obtained by superimposing a clock on the 8B6T converted code obtained by 8B6T conversion.
Figure 16A:
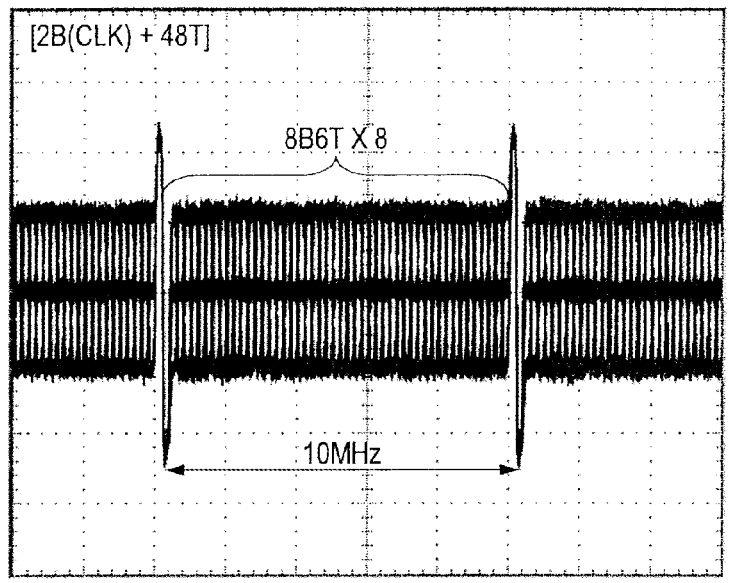
FIG. 16A is an explanatory diagram showing a concrete example of a signal waveform of a transmission signal obtained by superimposing a clock whose transmission speed is ⅕₀ on an 8B6T converted code obtained by 8B6T conversion.
Figure 16B:
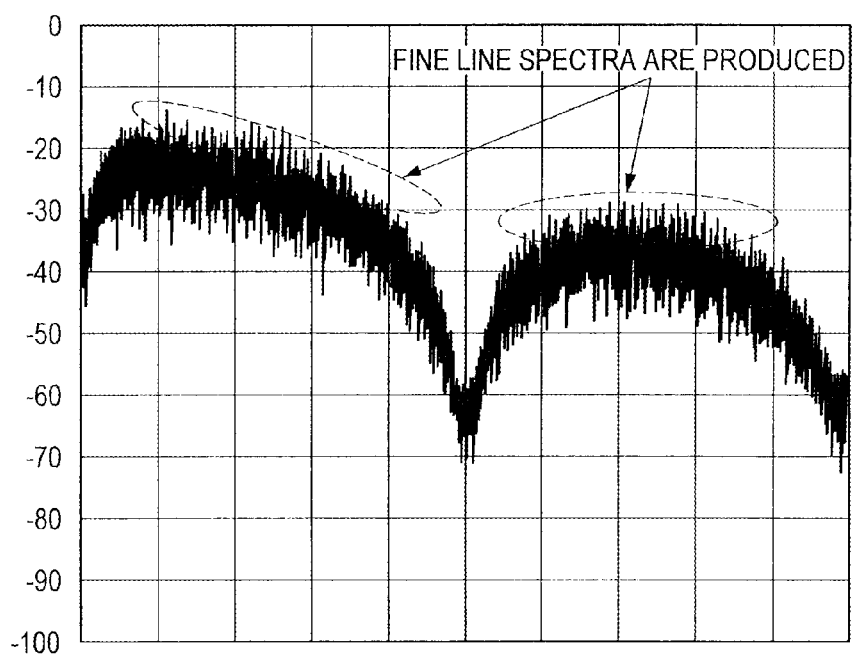
FIG. 16B is an explanatory diagram showing a concrete example of a frequency spectrum of the transmission signal obtained by superimposing a clock whose transmission speed is ⅕₀ on the 8B6T converted code obtained by 8B6T conversion.

Line spectra of the clock synchronously added to the transmission code are seen in the frequency spectrum of FIG. 15B. Also, the signal waveform, at the receiving side, of a multilevel code obtained by synchronously adding a clock having a frequency corresponding to 1/50 of the transmission speed of the transmission code is as shown in FIG. 16A. Also, the frequency spectrum of this multilevel code is as shown in FIG. 16B. Many fine line spectra corresponding to the clock that is synchronously added to the transmission code are seen in the frequency spectrum of FIG. 16B.

2-2: Configuration of Mobile Terminal 200 (Extended 8B6T Conversion Scheme)

Next, the functional configuration of a mobile terminal 200 according to the present embodiment will be described with reference to FIG. 11. FIG. 11 is an explanatory diagram showing a functional configuration example of a mobile terminal 200 according to the present embodiment. The mobile terminal 200 shown in FIG. 11 transmits data at high speed and with high transmission quality by using the encoding method based on the extended 8B6T conversion scheme described above.

Figure 11:
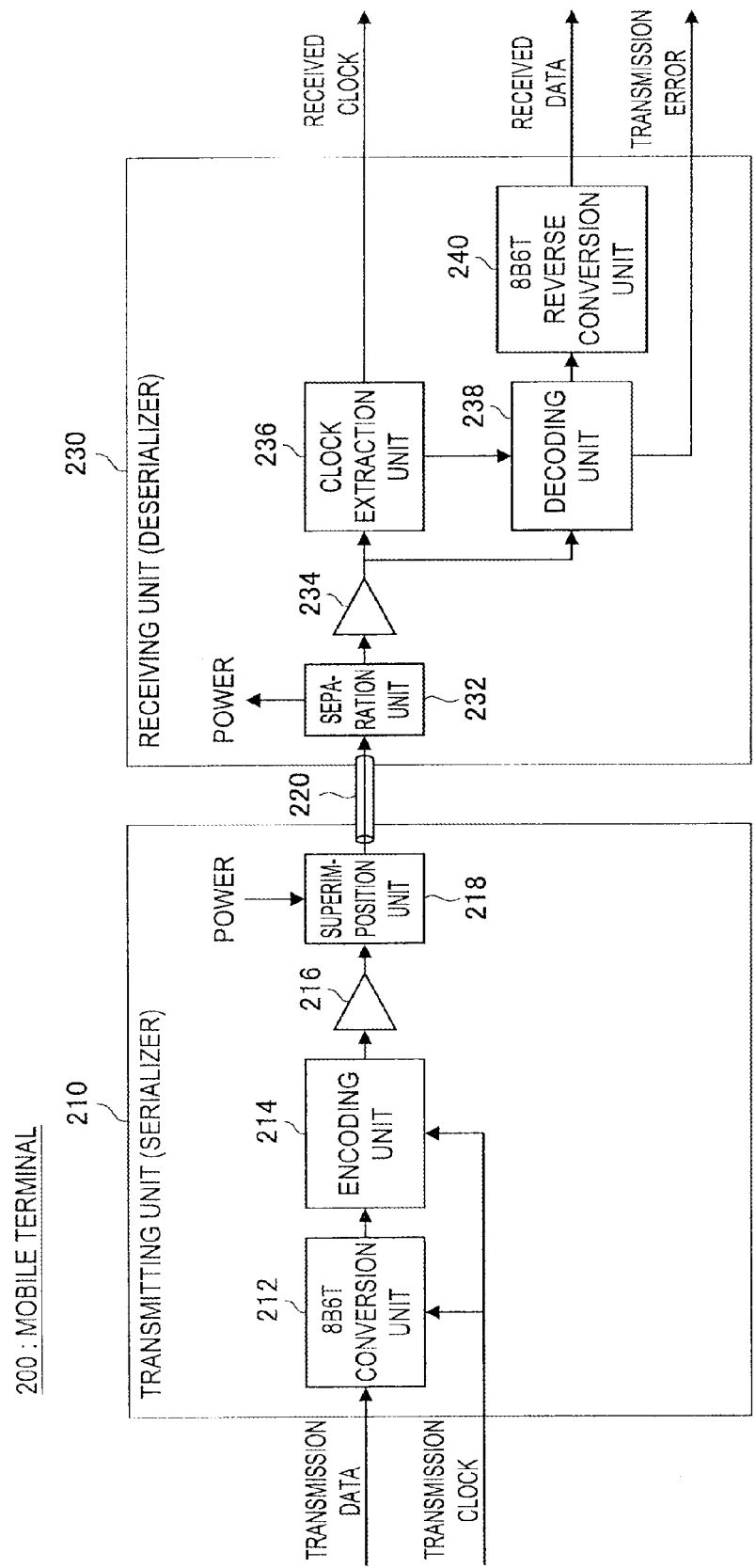
FIG. 11 is an explanatory diagram showing a functional configuration example of a mobile terminal according to the embodiment.

As shown in FIG. 11, the mobile terminal 200 is configured from a transmitting unit 210 and a receiving unit 230. Furthermore, the transmitting unit 210 and the receiving unit 230 are electrically connected by a coaxial cable 220. Additionally, the transmitting unit 210 corresponds to the serializer 134 of the mobile terminal 130 described above. However, the encoding method used by the transmitting unit 210 is different from that of the serializer 134 described above. Furthermore, the receiving unit 230 corresponds to the deserializer 138 of the mobile terminal 130 described above. However, the decoding method used by the receiving unit 230 is different from that of the deserializer 138 described above.

As shown in FIG. 11, the transmitting unit 210 mainly includes an 8B6T conversion unit 212, an encoding unit 214, a driver 216, and a superimposition unit 218. Also, the receiving unit 230 mainly includes a separation unit 232, a receiver 234, a clock extraction unit 236, a decoding unit 238, and an 8B6T reverse conversion unit 240. A storage unit that is not shown is provided in the transmitting unit 210 and the receiving unit 230. Additionally, a configuration is shown in the example of FIG. 11 of superimposing a transmission signal on a direct current and transmitting the same, but the application scope of the present embodiment is not limited to such.

First, transmission data and a transmission clock are input to the transmitting unit 210. The transmission data is input to the 8B6T conversion unit 212. Also, the transmission clock is input to the 8B6T conversion unit 212 and the encoding unit 214. The 8B6T conversion unit 212 converts the transmission data into an 8B6T code sequence by using the conversion table of the extended 8B6T conversion scheme illustrated in FIG. 9, and generates encoded data formed from an 8B6T code sequence. At this time, the 8B6T conversion unit 212 generates the encoded data according to the encoding method based on the extended 8B6T conversion scheme described above. The encoded data generated by the 8B6T conversion unit 212 is input to the encoding unit 214.

When the encoded data is input, the encoding unit 214 generates a multilevel transmission code by synchronously adding, to the encoded data, a clock having a frequency (Fb/2) corresponding to half the transmission speed (Fb) of the encoded data, as with the encoding method of the new scheme shown in FIG. 6. However, the amplitude of the clock to be added to the encoded data is to be larger than the maximum value of the amplitude of the encoded data. The multilevel transmission code generated by the encoding unit 214 in this manner is input to the driver 216 and is converted to an appropriate amplitude level.

The transmission code on which level conversion has been performed by the driver 216 is input to the superimposition unit 218. When the transmission code is input, the superimposition unit 218 generates a superimposed signal by superimposing a power signal supplied from the DC power supply on the transmission code. As described above, the multilevel transmission code generated by the transmitting unit 210 hardly contains DC components.

Therefore, even if the transmission code is superimposed on the power signal, the transmission signal and the power signal can be easily separated by using various types of filters. As described, by superimposing the transmission code on the power signal, both signals can be transmitted by one coaxial cable 220. As a result, it becomes unnecessary to separately wire a power line and a signal line.

Now, the superimposed signal generated by the superimposition unit 218 is transmitted to the receiving unit 230 through the coaxial cable 220. Then, the superimposed signal transmitted through the coaxial cable 220 is input to the separation unit 232. When the superimposed signal is input, the separation unit 232 separates the transmission code and the power signal from the superimposed signal. The power signal separated by the separation unit 232 is supplied to each structural element of the receiving unit 230 as power. On the other hand, the transmission code separated by the separation unit 232 is received by the receiver 234, and is input to the clock extraction unit 236 and the decoding unit 238.

When the transmission code is input, the clock extraction unit 236 detects the timing the amplitude level of the input transmission signal crosses zero, and regenerates the transmission clock based on the detection result. As described above, this transmission code is formed in such a way that the polarity of amplitude level is inverted every half cycle of the clock frequency.

Accordingly, a clock component can be extracted without using a PLL by detecting the timing the amplitude level of the transmission code crosses zero. The transmission clock regenerated by the clock extraction unit 236 in this manner is input to the decoding unit 238 as a received clock. Also, this received clock is output to the outside of the receiving unit 230.

Now, when the received clock is input, the decoding unit 238 determines the amplitude level of the multilevel transmission code with a specific threshold level as a reference and by using the input received clock. Then, the decoding unit 238 regenerates encoded data formed from a ternary 8B6T code sequence based on the determination result. The encoded data regenerated by the decoding unit 238 is input to the 8B6T reverse conversion unit 240.

When the encoded data is input, the 8B6T reverse conversion unit 240 extracts, in units of 6 symbols, ternary symbols included in the coded data, and calculates the DC balance for each set of 6 symbols. Furthermore, the 8B6T reverse conversion unit 240 selects a conversion table according to the calculated DC balance, and restores the original binary data by using an appropriate conversion table.

At this time, the 8B6T reverse conversion unit 240 restores the original binary data by a method of using TABLE-B in case the DC balance is +1 and TABLE-C in case the DC balance is −1, based on the decoding method according to the extended 8B6T conversion scheme described above. The binary data restored by the 8B6T reverse conversion unit 240 in this manner is output to the outside of the receiving unit 230. Additionally, a transmission error that is output from the decoding unit 238 is output to the outside.

Additionally, in case the receiving unit 230 corresponds to the deserializer 138 of the mobile terminal 130 described above, the received data output from the 8B6T reverse conversion unit 240 is output towards other structural elements of the display unit 102 in which the receiving unit 230 is provided. Also, the received clock output from the clock extraction unit 236 described above is output towards other structural elements of the display unit 102 in which the receiving unit 230 is provided.

(Structure of Transmission Frame)

Here, the structure of a transmission frame used at the time of transmitting the transmission code from the transmitting unit 210 to the receiving unit 230 will be briefly described with reference to FIG. 12. At the time of transmitting the transmission code, a synchronization code (SYNC) is added to the transmission data (transmission code) and a transmission frame is generated at the transmitting unit 210 (the encoding unit 214).

The synchronization code added here has a specific pattern, and is used to detect the beginning of the transmission frame. Additionally, a specific pattern according to which the DC balance will be 0 at the section of the synchronization code is desirable. In contrast, at the receiving unit 230 (the decoding unit 238), detection of the synchronization code is performed, and the transmission data is extracted with the detected position of the synchronization code as a reference.

Heretofore, the functional configuration of the mobile terminal 200 according to the present embodiment has been described. As described, by transmitting data by using the encoding method according to the extended 8B6T conversion scheme, the transmission speed can be increased without widening the frequency spectrum.

Furthermore, the 8B6T code sequence generated by the extended 8B6T conversion scheme is superior in DC balance, and thus a high transmission quality can be realized even in a low-frequency cutoff transmission line. Furthermore, since a scheme for synchronously adding a clock to the code and transmitting the same is adopted by the above-described mobile terminal 200, a PLL does not have to be provided at the receiving side, and the power consumption can be reduced to that extent.

Furthermore, according to the decoding method of the extended 8B6T conversion scheme of the present embodiment, a conversion table is selected according to the DC balance calculated for each set of 6 symbols, and thus there is an advantage that, even if the total DC balance of the 8B6T code sequences becomes unbalanced due to a transmission error in a certain set of 6 symbols, there is no possibility of the transmission error propagating to other sets of 6 symbols.

Additionally, the above-described configuration can be appropriately modified as long as it is within the technical scope of the present embodiment. For example, it is assumed here for the sake of explanation that the transmitting unit 210 and the receiving unit 230 are provided in one device. However, the transmitting unit 210 and the receiving unit 230 may be provided in separate devices.

3: MODIFIED EXAMPLES

Next, modified examples according to the present embodiment will be described. Heretofore, an explanation has been given taking 8B6T conversion as an example. However, the application scope of the present embodiment is not limited to 8B6T conversion. Thus, application examples of the present embodiment for conversion rules other than 8B6T conversion will be shown. Of course, the application scope of the present embodiment is not limited to the modified examples illustrated here, and the present embodiment can be applied to variety of coding rules. Those shown here are only examples.

3-1: (First Modified Example)

Extended 6B4Q Conversion Scheme

First, a first modified example of the present embodiment will be described. This modified example is a case where the technology according to the present embodiment is applied to 6B4Q conversion.

(3-1-1: Encoding Method of Extended 6B4Q Conversion Scheme)

The 6B4Q conversion mentioned above is a conversion rule for converting 6-bit binary data into 4 quaternary (base-4) symbols. The 6B4Q conversion rule can be expressed by conversion tables shown in FIGS. 18A and 18B, for example. As with the extended 8B6T conversion scheme described above, the present modified example proposes an extended 6B4Q conversion scheme which has extended the conversion tables.

(Structure of Conversion Table)

Examples of a conversion table used for the extended 6B4Q conversion are shown in FIGS. 18A and 18B. In these conversion tables, data before conversion, which is 6-bit binary data, and data after conversion, which is a combination of 4 quaternary symbols, are described in association with each other. For example, data before conversion 10 is associated with data after conversion: −1.5, +0.5, −0.5, +1.5. Furthermore, the conversion tables shown in FIGS. 18A and 18B are formed from 3 conversion tables (TABLE-A, TABLE-B, TABLE-C). However, TABLE-C is the inversion of TABLE-B, and illustration thereof is omitted.

(TABLE-A)

TABLE-A is a list of combinations according to which the DC balance of the data after conversion will be 0. For example, TABLE-A is a conversion table for converting 0 to 43, among 6-bit binary data, into 4 quaternary symbols. Additionally, the manner of pairing the data before conversion and the data after conversion in TABLE-A is not limited to that shown as long as the DC balances of the data after conversion are all 0.

(TABLE-B)

TABLE-B is a list of combinations according to which the DC balance of the data after conversion will be +1. For example, TABLE-B is a conversion table for converting 44 to 63, among 6-bit binary data, into 4 quaternary symbols. Additionally, the manner of pairing the data before conversion and the data after conversion in TABLE-B is not limited to that shown as long as the DC balances of the data after conversion are all +1.

(TABLE-C)

TABLE-C is a list of combinations according to which the DC balance of the data after conversion will be −1. In TABLE-C, the polarity of each symbol of the data after conversion in TABLE-B is inverted. For example, if the data after conversion corresponding to data before conversion 10 is −1.5, +0.5, −0.5, +1.5 in TABLE-B, the data after conversion in TABLE-C will be +1.5, −0.5, +0.5, −1.5.

That is, TABLE-C converts the polarity of a symbol of the data after conversion into a negative value in case the polarity has a positive value in TABLE-B, maintains the value 0, and converts the polarity into a positive value in case the polarity has a negative value in TABLE-B. With such polarity inversion performed, the DC balances of the data after conversion in TABLE-C will be −1.

(Encoding Method: Extended 6B4Q Conversion)

The extended 6B4Q conversion according to the present modified example is for generating a 6B4Q code sequence with a superior DC balance by using the above-described TABLE-A, TABLE-B and TABLE-C. Here, an encoding method based on the extended 6B4Q conversion scheme will be described.

First, binary data which is the target of conversion (data before conversion) is input, and is converted, in units of 6 bits, into 4 quaternary symbols (data after conversion) based on the conversion tables shown in FIGS. 18A and 18B. At this time, the DC balance of the data after conversion is added to the DC balance of data after conversion that was converted in the past, and the result is maintained as the total of the past DC balance.

Then, when converting the binary data that is input next, if the binary data is data that is described in TABLE-B or TABLE-C, the conversion table to be used (TABLE-B or TABLE-C) is selected according to the total of the past DC balance that is maintained.

(1) For example, in case the total of the past DC balance is +1 and the binary data which is the target of conversion is data described in TABLE-B or TABLE-C, the conversion process is performed by using TABLE-C.

(2) Also, in case the total of the past DC balance is −1 and the binary data which is the target of conversion is data described in TABLE-B or TABLE-C, the conversion process is performed by using TABLE-B.

(3) Furthermore, in case the total of the past DC balance is 0 and the binary data which is the target of conversion is data described in TABLE-B or TABLE-C, the conversion process may be performed by using either table. However, it is desirable that TABLE-B and TABLE-C are used alternately.

By encoding based on the coding rules of (1) to (3) described above, the DC balance of a 6B4Q code sequence is compensated for at every conversion process, and the DC balance of the 6B4Q code sequence is maintained in a good condition. Additionally, TABLE-C is the inversion of TABLE-B, and thus, instead of performing conversion by using TABLE-C, it is also possible to invert the polarities of the symbols of data after conversion obtained by converting by TABLE-B. With this structure, the data amount of conversion table to be maintained can be reduced.

(Decoding Method: Extended 6B4Q Reverse Conversion)

As described above, the encoding method according to the present modified example switches the conversion table for data after conversion according to the DC balance of a 6B4Q code sequence. Accordingly, at the time of decoding the 6B4Q code sequence generated by the extended 6B4Q conversion, a conversion table (TABLE-B or TABLE-C) to be used for extended 6B4Q reverse conversion that is performed in units of 4 bits has to be appropriately selected. First, 4 symbols are sequentially read out from an input 6B4Q code sequence, and the DC balance of each set of 4 symbols is calculated.

(1) In case the calculated DC balance of 4 symbols is +1, the extended 6B4Q reverse conversion is performed by using TABLE-B, and 6-bit binary data is restored. (2) Also, in case the calculated DC balance of 4 symbols is −1, the extended 6B4Q reverse conversion is performed by using TABLE-C, and 6-bit binary data is restored. (3) Furthermore, in case the calculated DC balance of 4 symbols is 0, the extended 6B4Q reverse conversion is performed by using TABLE-A, and 6-bit binary data is restored. As such, the DC balance of 4 symbols is referred to at the time of decoding, and the conversion table to be used is appropriately selected according to the DC balance.

Heretofore, the encoding method of the extended 6B4Q conversion scheme according to the present modified example has been described. Also, the decoding method of a 6B4Q code sequence generated by the encoding method of the extended 6B4Q conversion scheme has also been described. By using the encoding method and the decoding method above, the transmission speed can be increased without deteriorating the transmission quality in the low-frequency cutoff transmission line. In the case of 6B4Q conversion, 6-bit data is converted into a 6B4Q code with 4 symbols, and the transmission speed can be increased by 6/4=1.5 times.

The two examples (8B6T, 6B4Q) which have been described above put first the increase in the transmission speed by the conversion into a multilevel code. Accordingly, a method is adopted where an encoding process is performed by using a table including a conversion rule for converting a code into a code with a DC balance +1, and compensating the DC balance at the time of the encoding process.

However, as shown in FIG. 18A, 44 of the 4Q codes can be made to be codes with a DC balance 0, and thus 5B4Q codes for which compensation of the DC balance is unnecessary can be generated by using a conversion rule for converting not the 6B (64 types) data but 5B (32 types) data into the 44 codes. That is, a method can be realized that converts all of the 5B data by only TABLE-A of FIG. 18A. However, the transmission speed will be 5/4=1.25 times.

Similarly, an 8B7T code for which compensation of the DC balance is unnecessary can be generated from the table of FIG. 9.

Figure 19A:
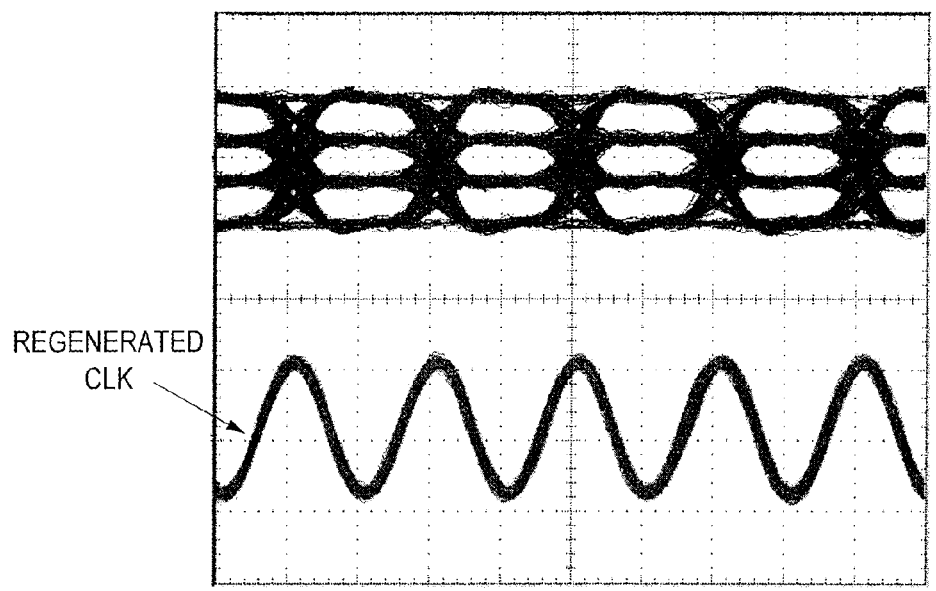
FIG. 19A is an explanatory diagram showing a concrete example of an eye pattern of a 6B4Q converted code obtained by 6B4Q conversion.
Figure 19B:
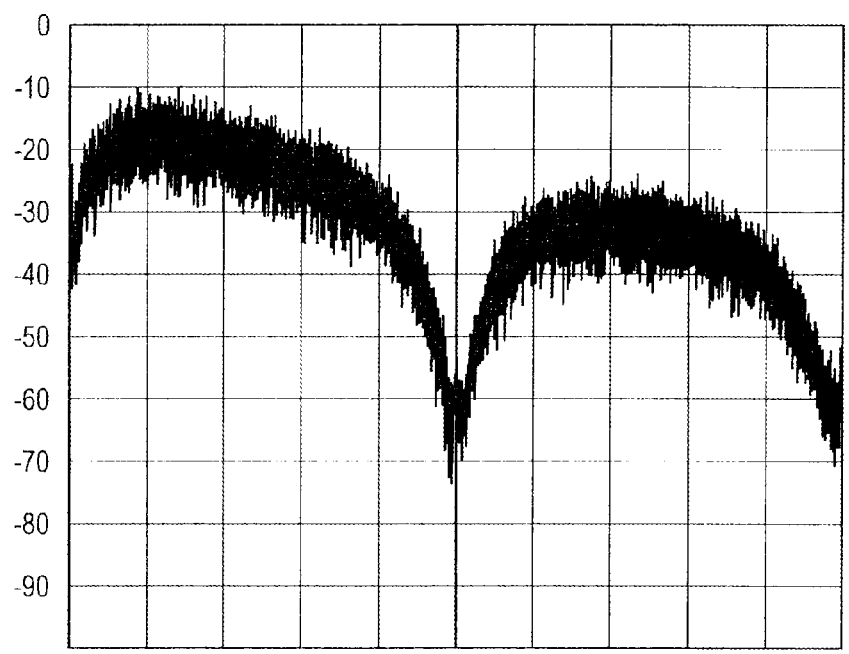
FIG. 19B is an explanatory diagram showing a concrete example of a frequency spectrum of the 6B4Q converted code obtained by 6B4Q conversion.
Figure 20A:
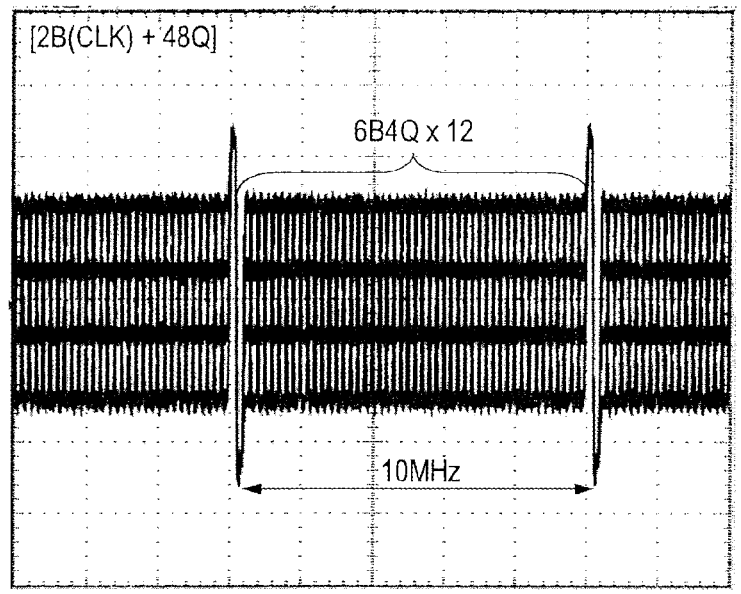
FIG. 20A is an explanatory diagram showing a concrete example of a signal waveform of a transmission signal obtained by superimposing a clock whose transmission speed is 1/50 on a 6B4Q converted code obtained by 6B4Q conversion.

Additionally, the eye pattern, at the receiving side, of the 6B4Q code sequence (transmission code) according to the extended 6B4Q conversion scheme will take a form as shown in FIG. 19A. A regenerated clock is also shown in FIG. 19A. Also, the frequency spectrum of this transmission code will take a form as shown in FIG. 19B. Furthermore, the signal waveform, at the receiving side, of a multilevel code to which a clock having a frequency corresponding to 1/50 of the transmission speed of this transmission code is synchronously added will be as shown in FIG. 20A.

Figure 20B:
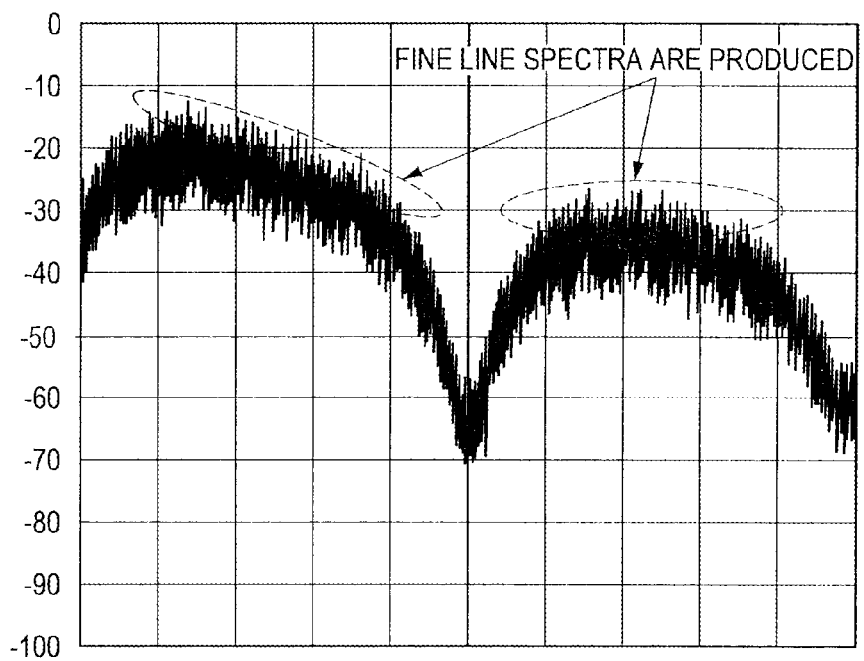
FIG. 20B is an explanatory diagram showing a concrete example of a frequency spectrum of the transmission signal obtained by superimposing a clock whose transmission speed is 1/50 on the 6B4Q converted code obtained by 6B4Q conversion.
Figure 21A:
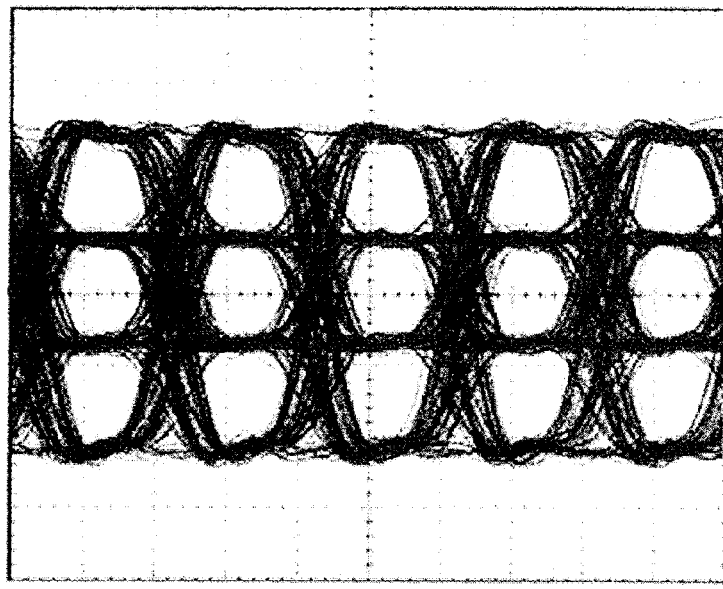
FIG. 21A is an explanatory diagram showing a concrete example of a signal waveform of a transmission signal obtained by performing DC balance compensation on a 6B4Q converted code obtained by 6B4Q conversion.
Figure 21B:
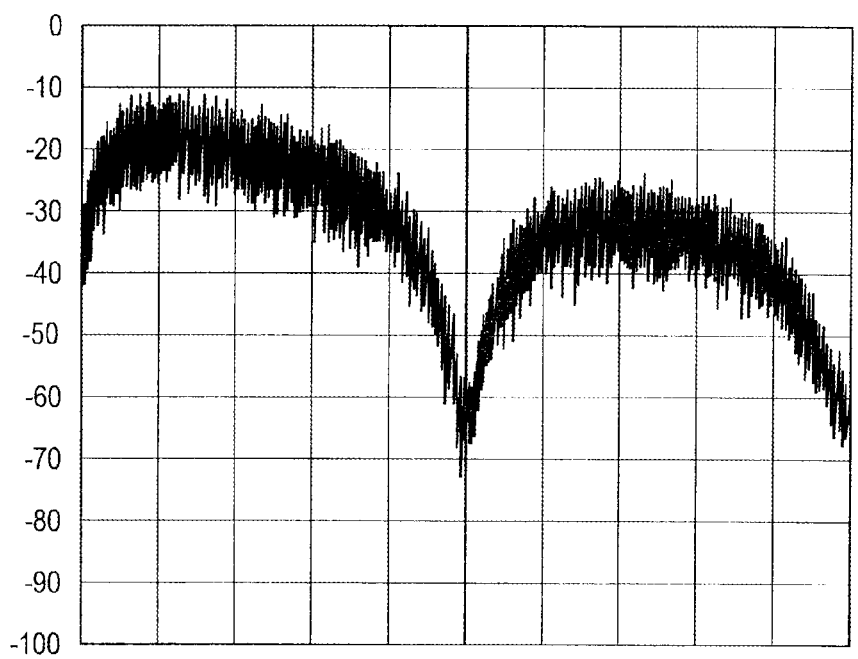
FIG. 21B is an explanatory diagram showing a concrete example of a frequency spectrum of the transmission signal obtained by performing DC balance compensation on the 6B4Q converted code obtained by 6B4Q conversion.

Also, the frequency spectrum of this multilevel code will be as shown in FIG. 20B. Many fine line spectra corresponding to the clock that is synchronously added to the transmission code are seen in the frequency spectrum of FIG. 20B. Furthermore, the eye pattern, at the receiving side, of the multilevel code obtained by synchronously adding a clock having a frequency corresponding to half the transmission speed of this transmission code will be as shown in FIG. 21A. Also, the frequency spectrum of this multilevel code will be as shown in FIG. 21B. Line spectra of the clock synchronously added to the transmission code are seen in the frequency spectrum of FIG. 21B.

(3-1-2: Configuration of Mobile Terminal 300 (Extended 6B4Q Conversion Scheme))

Figure 17:
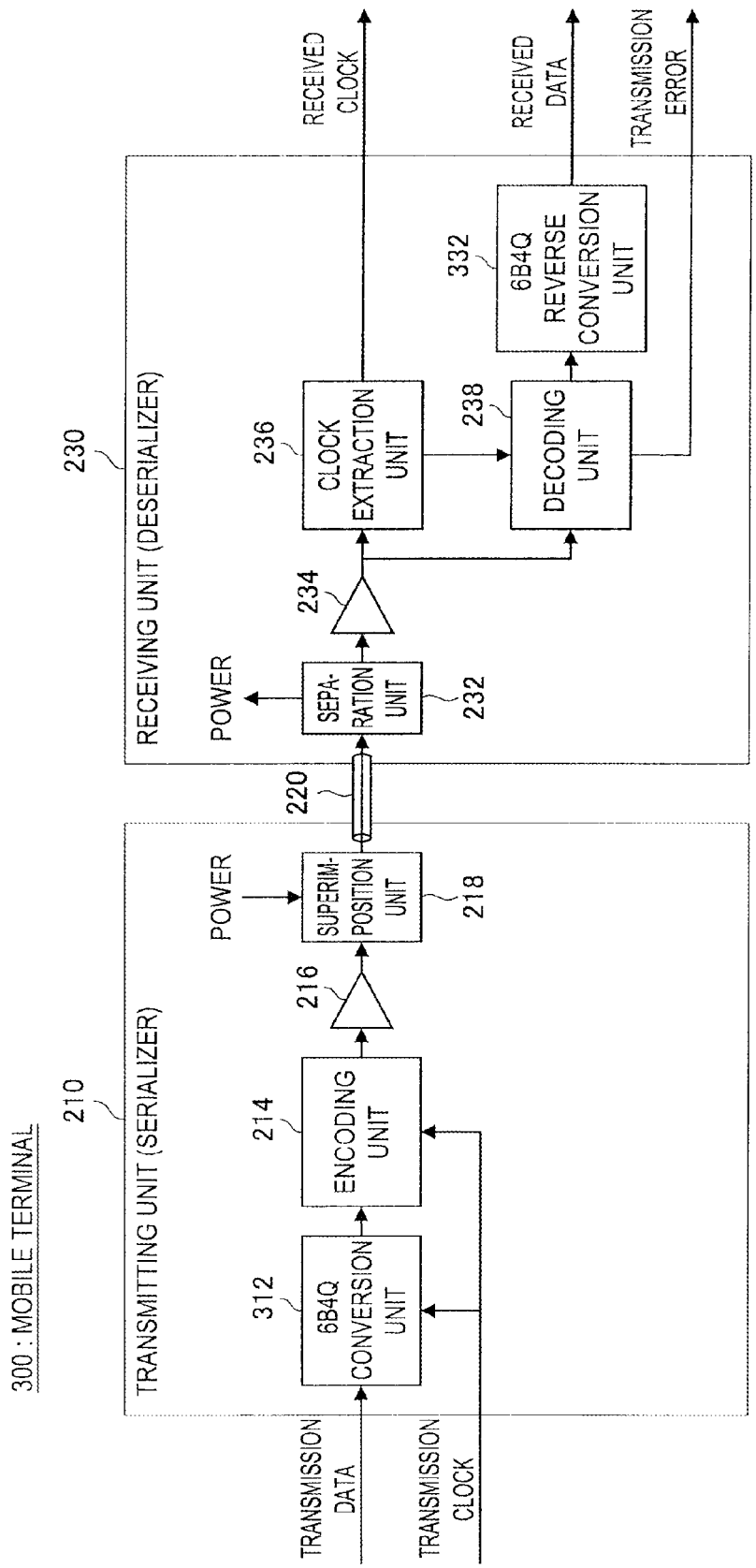
FIG. 17 is an explanatory diagram showing a functional configuration example of a mobile terminal according to a first modified example (6B4Q) of the embodiment.

Next, the functional configuration of a mobile terminal 300 according to the present modified example will be described with reference to FIG. 17. FIG. 17 is an explanatory diagram showing a functional configuration example of a mobile terminal 300 according to the present modified example. The mobile terminal 300 shown in FIG. 17 transmits data at high speed and with high transmission quality by using the encoding method based on the extended 6B4Q conversion scheme described above. Additionally, structural elements that have substantially the same functions as those of the mobile terminal 200 described above will be denoted with the same reference numerals, and detailed explanation of these structural elements is omitted.

As shown in FIG. 17, the transmitting unit 210 mainly includes the encoding unit 214, the driver 216, the superimposition unit 218, and a 6B4Q conversion unit 312. Also, the receiving unit 230 mainly includes the separation unit 232, the receiver 234, the clock extraction unit 236, the decoding unit 238, and a 6B4Q reverse conversion unit 332. Additionally, a configuration is shown in the example of FIG. 17 of superimposing a transmission signal on a direct current and transmitting the same, but the application scope of the present embodiment is not limited to such.

First, transmission data and a transmission clock are input to the transmitting unit 210. The transmission data is input to the 6B4Q conversion unit 312. Also, the transmission clock is input to the 6B4Q conversion unit 312 and the encoding unit 214. The 6B4Q conversion unit 312 converts the transmission data into a 6B4Q code sequence by using the conversion tables of the extended 6B4Q conversion scheme illustrated in FIGS. 18A and 18B, and generates encoded data formed from a 6B4Q code sequence. At this time, the 6B4Q conversion unit 312 generates the encoded data according to the encoding method based on the extended 6B4Q conversion scheme described above. The encoded data generated by the 6B4Q conversion unit 312 is input to the encoding unit 214.

When the encoded data is input, the encoding unit 214 generates a multilevel transmission code by synchronously adding, to the encoded data, a clock having a frequency (Fb/2) corresponding to half the transmission speed (Fb) of the encoded data, as with the encoding method of the new scheme shown in FIG. 6. However, the amplitude of the clock to be added to the encoded data is to be larger than the maximum value of the amplitude of the encoded data. The multilevel transmission code generated by the encoding unit 214 in this manner is input to the driver 216 and is converted to an appropriate amplitude level.

The transmission code on which level conversion has been performed by the driver 216 is input to the superimposition unit 218. When the transmission code is input, the superimposition unit 218 generates a superimposed signal by superimposing a power signal supplied from the DC power supply on the transmission code. As described above, the multilevel transmission code generated by the transmitting unit 210 hardly contains DC components.

Therefore, even if the transmission code is superimposed on the power signal, the transmission signal and the power signal can be easily separated by using various types of filters. As described, by superimposing the transmission code on the power signal, both signals can be transmitted by one coaxial cable 220. As a result, it becomes unnecessary to separately wire a power line and a signal line.

Now, the superimposed signal generated by the superimposition unit 218 is transmitted to the receiving unit 230 through the coaxial cable 220. Then, the superimposed signal transmitted through the coaxial cable 220 is input to the separation unit 232. When the superimposed signal is input, the separation unit 232 separates the transmission code and the power signal from the superimposed signal. The power signal separated by the separation unit 232 is supplied to each structural element of the receiving unit 230 as power. On the other hand, the transmission code separated by the separation unit 232 is received by the receiver 234, and is input to the clock extraction unit 236 and the decoding unit 238.

When the transmission code is input, the clock extraction unit 236 detects the timing the amplitude level of the input transmission signal crosses zero, and regenerates the clock based on the detection result. The clock regenerated by the clock extraction unit 236 is input to the decoding unit 238 as a received clock. Furthermore, this received clock is output to the outside of the receiving unit 230.

Now, when the received clock is input, the decoding unit 238 determines the amplitude level of the multilevel transmission code with a specific threshold level as a reference and by using the input received clock. Then, the decoding unit 238 regenerates the encoded data formed from a quaternary 6B4Q code sequence based on the determination result.

The encoded data regenerated by the decoding unit 238 is input to the 6B4Q reverse conversion unit 332. When the encoded data is input, the 6B4Q reverse conversion unit 332 extracts, in units of 4 symbols, quaternary symbols included in the encoded data, and calculates the DC balance for each set of 4 symbols. Furthermore, the 6B4Q reverse conversion unit 332 selects a conversion table according to the calculated DC balance, and restores the original binary data by using an appropriate conversion table.

At this time, the 6B4Q reverse conversion unit 332 restores the original binary data by a method of using TABLE-B in case the DC balance is +1 and TABLE-C in case the DC balance is −1, based on the decoding method according to the extended 6B4Q conversion scheme described above. The binary data restored by the 6B4Q reverse conversion unit 332 in this manner is output to the outside of the receiving unit 230. Additionally, a transmission error that is output from the decoding unit 238 is output to the outside.

Heretofore, the functional configuration of the mobile terminal 300 according to the present modified example has been described. As described, by transmitting data by using the encoding method according to the extended 6B4Q conversion scheme, the transmission speed can be increased without widening the frequency spectrum.

Furthermore, the 6B4Q code sequence generated by the extended 6B4Q conversion scheme is superior in DC balance, and thus a high transmission quality can be realized even in a low-frequency cutoff transmission line. Furthermore, since a scheme for synchronously adding a clock to the code and transmitting the same is adopted by the above-described mobile terminal 300, a PLL does not have to be provided at the receiving side, and the power consumption can be reduced to that extent.

Furthermore, according to the decoding method of the extended 6B4Q conversion scheme of the present modified example, a conversion table is selected according to the DC balance calculated for each set of 4 symbols, and thus there is an advantage that, even if the total DC balance of the 6B4Q code sequences becomes unbalanced due to a transmission error in a certain set of 4 symbols, there is no possibility of the transmission error propagating to other sets of 4 symbols. Furthermore, the extended 6B4Q conversion scheme has a higher coding rate (150%) than the coding rate (133%) of the extended 8B6T conversion scheme.

3-2: (Second Modified Example)

Extended 8B5Q Conversion Scheme

Next, a second modified example according to the present embodiment will be briefly described. As with the extended 8B6T conversion scheme and the extended 6B4Q conversion scheme described above, the present modified example relates to an extended 8B5Q conversion scheme which is an extension of the 8B5Q conversion. The 8B5Q conversion is for converting 8-bit binary data into 5 quaternary symbols. Additionally, the encoding method, the decoding method, and the functional configuration of the mobile terminal according to the present modified example are the same as those of the extended 8B6T conversion scheme and the extended 6B4Q conversion scheme.

Figure 22A:
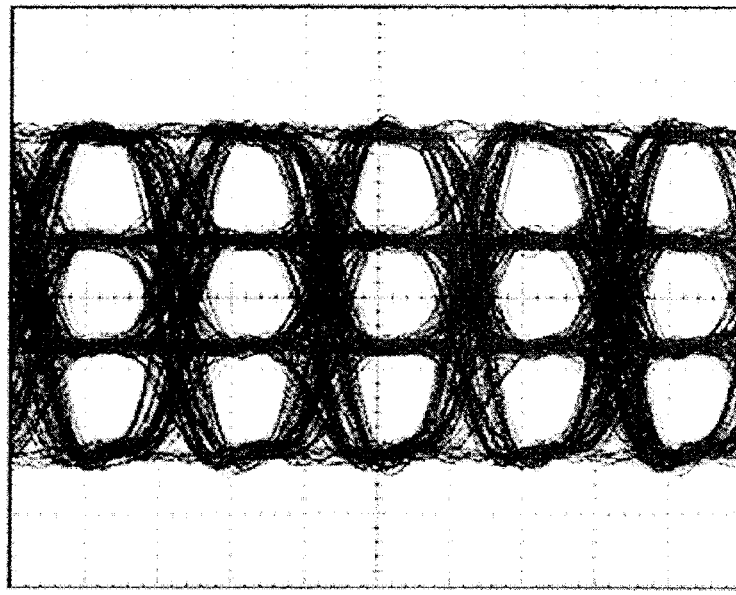
FIG. 22A is an explanatory diagram showing a concrete example of a signal waveform of a transmission signal obtained by performing DC balance compensation on an 8B5Q converted code obtained by 8B5Q conversion (second modified example)
Figure 22B:
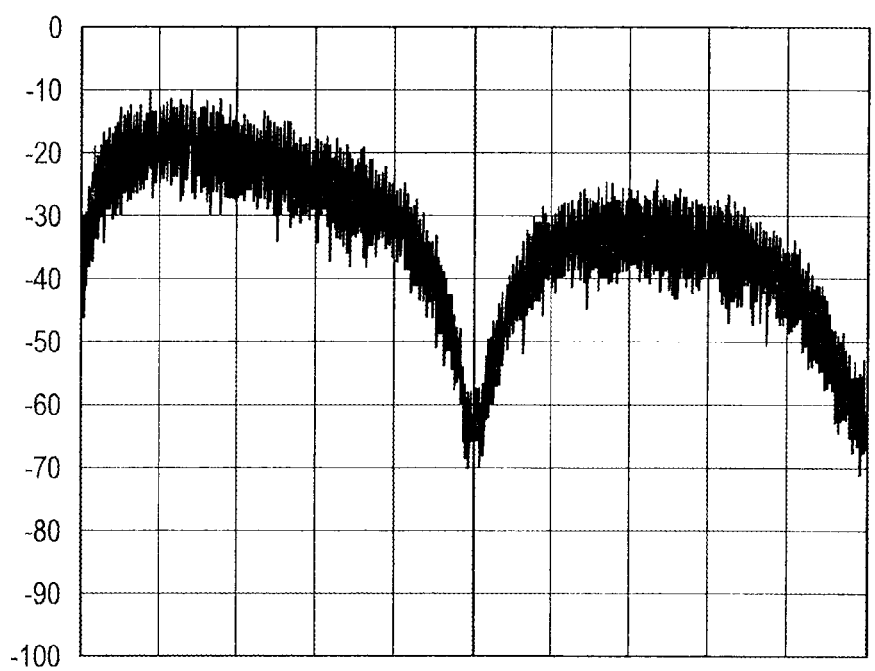
FIG. 22B is an explanatory diagram showing a concrete example of a frequency spectrum of the transmission signal obtained by performing DC balance compensation on the 8B5Q converted code obtained by 8B5Q conversion (second modified example).

However, the coding rate of the extended 8B5Q conversion scheme is 8/5×100=160%. Accordingly, by applying the extended 8B5Q conversion scheme, data transmission even faster than according to the extended 8B6T conversion scheme and the extended 6B4Q conversion scheme described above can be realized. Furthermore, the eye pattern, at the receiving side, of an 8B5Q code sequence generated by the encoding method of the extended 8B5Q conversion scheme will take a form as shown in FIG. 22A. Also, the frequency spectrum of this 8B5Q code will take a form as shown in FIG. 22B.

As described, as with the extended 8B6T conversion scheme and the extended 6B4Q conversion scheme, the extended 8B5Q conversion scheme also enables to increase the transmission speed without widening the frequency spectrum. Also, the 8B5Q code sequence generated by the extended 8B5Q conversion scheme is superior in DC balance, and thus a high transmission quality can be realized even in a low-frequency cutoff transmission line.

Additionally, "T" of 8B6T is an abbreviation for Ternary, and "Q" of 6B4Q and 8B5Q is an abbreviation for Quaternary. Also, the mobile terminals 200 and 300 described above can be applied to the mobile terminal 130 shown in FIG. 2. For example, the mobile terminal 130 can be configured from the display unit 102, the connecting unit 106 and the operation unit 108, and the above-described codes can be used for transmitting data output from the baseband processor 110 to a structural element such as the liquid crystal unit 104 or the display unit 102.

4: SUMMARY

Lastly, the technical contents according to the present embodiment will be briefly described. The technical contents stated here can be applied to various electronic devices, such as a personal computer, a mobile phone, a portable game machine, a portable information terminal, an information appliance, a car navigation system, and the like. It is suitably used particularly for an electronic device for which high-speed data transmission within the electronic device is desired.

The functional configuration of the information processing apparatus described above can be expressed as follows. This information processing apparatus includes an encoding unit that generates encoded data formed from a sequence of base-k data in which m pieces (m<n) of base-k symbols are combined, by converting input binary data in units of n bits based on a specific conversion rule that associates n-bit binary data and the base-k data, and in case a DC balance of the base-k data obtained after conversion has a polarity, the encoding unit controls a polarity of a symbol included in the base-k data obtained after conversion such that the polarity of the DC balance of the base-k data obtained after conversion is different from a polarity of a DC balance of a sequence of base-k data previous to the base-k data obtained after conversion.

In the description above, the extended 8B6T conversion scheme according to which n is 8, k is 3 and m is 6, the extended 6B4Q conversion scheme according to which n is 6, k is 4 and m is 4, and the extended 8B5Q conversion scheme according to which n is 8, k is 4 and m is 5 are illustrated. By expressing n bits by m symbols, the coding rate is improved to n/m (m<n), and the data transmission speed can be increased.

Furthermore, by reversing the DC balance of m symbols in case the DC balance of m symbols obtained after conversion have the same polarity as the previous DC balance, the DC balance of the encoded data as a whole can be suitably maintained.

With this configuration, the transmission speed can be increased without the frequency spectrum at the time of transmitting the encoded data becoming wide, and further, the transmission quality is not deteriorated in a DC cutoff transmission line.

(Notes)

The mobile terminals 200 and 300 are examples of an encoding apparatus and an information processing apparatus. The 8B6T conversion unit 212 and the 6B4Q conversion unit 312 are examples of an encoding unit. The TABLE-A is an example of a first conversion table. The TABLE-B is an example of a second conversion table. The TABLE-C is an example of a third conversion example. The transmitting unit 210 is an example of a first module.

The receiving unit 230 is an example of a second module. The driver 216 and the superimposition unit 218 are examples of a data transmitting unit. The separation unit 232 and the receiver 234 are examples of a data receiving unit. The 8B6T reverse conversion unit 240 and the 6B4Q reverse conversion unit 332 are examples of a decoding unit.

The encoding unit 214 is an example of a clock addition unit. The clock extraction unit 236 is an example of a clock regeneration unit. The coaxial cable 220 is an example of a specific signal line. The baseband processor 110 is an example of an arithmetic processing unit. The liquid crystal unit 104 is an example of a display unit.

It should be understood by those skilled in the art that various modifications, combinations, sub-combinations and alterations may occur depending on design requirements and other factors insofar as they are within the scope of the appended claims or the equivalents thereof.

The present application contains subject matter related to that disclosed in Japanese Priority Patent Application JP 2009-187371 filed in the Japan Patent Office on Aug. 12, 2009, the entire content of which is hereby incorporated by reference.

What is claimed is:

1. An encoding apparatus comprising:
an encoding unit that generates encoded data formed from a sequence of base-k data in which m pieces (m<n) of base-k symbols are combined, by converting input n-bit binary data, in units of n bits, based on a specific conversion rule that associates n-bit binary data and the base-k data,
wherein the specific conversion rule is a conversion rule that associates the n-bit binary data and the base-k data whose DC balance is zero;
wherein a combination of the k, m, and n (k, m, n) is either (4, 5, 6) or (3, 7, 8).

2. An information processing apparatus comprising:
a first module that includes:
an encoding unit to generate encoded data by converting input n-bit binary data, in units of n bits, based on a specific conversion rule that associates n-bit binary data and base-k data in which m pieces (m<n) of base-k symbols are combined, and by controlling, in case a DC balance of the base-k data obtained after conversion has a polarity, a polarity of a symbol included in the base-k data obtained after conversion such that the polarity of the DC balance of the base-k data obtained after conversion is different from a polarity of a DC balance of a sequence of base-k data previous to the base-k data obtained after conversion, and
a data transmitting unit to transmit the encoded data generated by the encoding unit; and
a second module that includes
a data receiving unit to receive the encoded data transmitted from the first module, and
a decoding unit to detect the polarity of the DC balance of each of the base-k data included in the encoded data received by the data receiving unit, and to decode the encoded data based on the polarity of the DC balance of each of the base-k data that has been detected and based on the specific conversion rule;
wherein the first module further includes a clock addition unit to synchronously add, to the encoded data, a clock having an amplitude value larger than a maximum value for the symbol and having a speed half a symbol speed,
wherein the second module further includes a clock regeneration unit to detect a cycle of polarity inversion of an amplitude of the encoded data received by the data receiving unit and to regenerate the clock based on the detection result, and
wherein the decoding unit decodes the encoded data by using the clock regenerated by the clock regeneration unit.

3. The information processing apparatus according to claim 2,
wherein, among the n-bit binary data, K pieces of the n-bit binary data are associated with the base-k data having a DC balance of zero and ($2^n$–K) pieces of the n-bit binary data are associated with the base-k data having a positive DC balance, according to the specific conversion rule,
wherein, in case the DC balance of the base-k data obtained after conversion is positive, if a sequence of base-k data previous to the base-k data obtained after conversion has a positive DC balance, the encoding unit reverses signs of m symbols included in the base-k data obtained after conversion, and
wherein the decoding unit decodes the encoded data based on the specific conversion rule after reversing a sign of each symbol included in base-k data for which a negative DC balance is detected.

4. The information processing apparatus according to claim 2,
wherein the first module further includes a storage unit that stores:
a first conversion table to associate K pieces of the n-bit binary data with the base-k data having a DC balance of zero, according to the specific conversion rule,
a second conversion table to associate ($2^n$–K) pieces of the n-bit binary data with the base-k data having a positive DC balance, according to the specific conversion rule, and
a third conversion table to associate the ($2^n$–K) pieces of the n-bit binary data with base-k data having a negative DC balance, the base-k data having a negative DC balance being obtained by reversing signs of m symbols included in the base-k data having a positive DC balance,
wherein, in case the n-bit binary data that is to be converted corresponds to the ($2^n$–K) pieces of the n-bit binary data, if a sequence of base-k data previous to base-k data to be obtained by converting the n-bit binary data that is to be converted has a positive DC balance in a sequence of the base-k data, the encoding unit converts the n-bit binary data that is to be converted by using the third conversion table, and if the sequence of the base-k data previous to the base-k data to be obtained by converting the n-bit binary data that is to be converted has a negative DC balance, the encoding unit converts the n-bit binary data that is to be converted by using the second conversion table,
wherein the second module further includes a storage unit to store the first conversion table, the second conversion table, and the third conversion table, and
wherein the decoding unit decodes the encoded data by using the first conversion table for base-k data for which a DC balance of zero is detected, by using the second conversion table for base-k data for which a positive DC balance is detected, and by using the third conversion table for base-k data for which a negative DC balance is detected.

5. The information processing apparatus according to claim 2,
wherein the first module and the second module are connected by a specific signal line,
wherein the data transmitting unit generates a superimposed signal by superimposing a power signal supplied from a DC power supply on the encoded data, and transmits the superimposed signal through the specific signal line, and
wherein the data receiving unit receives the superimposed signal through the specific signal line, and separates the power signal and the encoded data from the superimposed signal.

6. The information processing apparatus according to claim 2,
wherein the first module further includes an arithmetic processing unit that outputs at least display data,
wherein the second module further includes a display unit that displays the display data, wherein the encoding unit generates encoded data by converting binary data corresponding to the display data output from the arithmetic processing unit into a sequence of the base-k data, and wherein the decoding unit restores the binary data corresponding to the display data by decoding the encoded data, and inputs the binary data to the display unit.

7. An information processing apparatus comprising:

a first module that includes
- an encoding unit to generate encoded data by converting input n-bit binary data, in units of n bits, based on a specific conversion rule that associates n-bit binary data and base-k data in which m pieces (m<n) of base-k symbols are combined in such a way that a DC balance becomes zero, and
- a data transmitting unit to transmit the encoded data generated by the encoding unit; and a second module that includes:
- a data receiving unit to receive the encoded data transmitted from the first module, and
- a decoding unit to decode the encoded data received by the data receiving unit, based on the specific conversion rule;

wherein a combination of the k, m, and n (k, m, n) is either (4, 5, 6) or (3, 7, 8).

* * * * *